US012622303B2

(12) United States Patent
Li et al.

(10) Patent No.: US 12,622,303 B2
(45) Date of Patent: May 5, 2026

(54) NOTCHED WAFER AND BONDING SUPPORT STRUCTURE TO IMPROVE WAFER STACKING

(71) Applicant: Taiwan Semiconductor Manufacturing Company, Ltd., Hsinchu (TW)

(72) Inventors: Sheng-Chan Li, Tainan City (TW); Cheng-Hsien Chou, Tainan City (TW); Sheng-Chau Chen, Tainan City (TW); Cheng-Yuan Tsai, Chu-Pei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 379 days.

(21) Appl. No.: 18/311,304

(22) Filed: May 3, 2023

(65) Prior Publication Data

US 2023/0275064 A1 Aug. 31, 2023

Related U.S. Application Data

(62) Division of application No. 17/197,254, filed on Mar. 10, 2021, now Pat. No. 11,682,652.

(51) Int. Cl.
*H01L 23/00* (2006.01)
*H01L 21/02* (2006.01)
(Continued)

(52) U.S. Cl.
CPC ........ *H01L 24/94* (2013.01); *H01L 21/02164* (2013.01); *H01L 21/67121* (2013.01);
(Continued)

(58) Field of Classification Search
CPC ........... H01L 21/76832; H01L 21/8221; H01L 2224/0231; H01L 2224/02373;
(Continued)

(56) References Cited

U.S. PATENT DOCUMENTS

| 7,057,259 B2 * | 6/2006 | Arikado | H01L 23/544 |
| | | | 257/E23.179 |
| 7,700,381 B2 * | 4/2010 | Arikado | H01L 23/544 |
| | | | 356/30 |

(Continued)

FOREIGN PATENT DOCUMENTS

| CN | 112447554 A | 3/2021 |
| JP | 2006245617 A | 9/2006 |

(Continued)

OTHER PUBLICATIONS

Non-Final Office Action dated Sep. 29, 2022 for U.S. Appl. No. 17/197,254.

(Continued)

*Primary Examiner* — Telly D Green
(74) *Attorney, Agent, or Firm* — Eschweiler & Potashnik, LLC

(57) ABSTRACT

Various embodiments of the present disclosure are directed towards a processing tool. The processing tool includes a housing structure defining a chamber. A first plate is disposed in the chamber. A first plasma exclusion zone (PEZ) ring is disposed on the first plate. A second plate is disposed in the chamber and underlies the first plate. A second PEZ ring is disposed on the second plate. The second PEZ ring comprises a PEZ ring notch that extends inwardly from a circumferential edge of the second PEZ ring.

20 Claims, 13 Drawing Sheets

(51) Int. Cl.
 *H01L 21/67*   (2006.01)
 *H01L 23/544*  (2006.01)
 *H01L 25/065*  (2023.01)

(52) U.S. Cl.
 CPC ............ *H01L 23/544* (2013.01); *H01L 24/80* (2013.01); *H01L 25/0657* (2013.01); *H01L 2224/80007* (2013.01); *H01L 2224/80132* (2013.01); *H01L 2224/80895* (2013.01); *H01L 2224/80896* (2013.01)

(58) Field of Classification Search
 CPC ... H01L 2224/0345; H01L 2224/03452; H01L 2224/03462; H01L 2224/03464; H01L 2224/05008; H01L 2224/05569; H01L 2224/05576; H01L 2224/05624; H01L 2224/05647; H01L 2224/05684; H01L 2224/05686; H01L 2224/08145; H01L 2224/80001; H01L 2224/80357; H01L 2224/80805; H01L 2224/80895; H01L 2224/80896; H01L 2224/94; H01L 23/3171; H01L 23/3192; H01L 23/5226; H01L 23/5283; H01L 23/53295; H01L 24/03; H01L 24/08; H01L 24/09; H01L 24/80; H01L 24/89; H01L 24/94; H01L 25/0655; H01L 25/0657; H01L 25/50; H01L 2924/00014; H01L 2924/013; H01L 2924/049; H01L 2924/053
 See application file for complete search history.

(56)    References Cited

U.S. PATENT DOCUMENTS

| | | | | |
|---|---|---|---|---|
| 9,768,089 | B2 * | 9/2017 | Rajoo | ................. H01L 21/6835 |
| 10,734,285 | B2 * | 8/2020 | Li | ........................... H01L 24/94 |
| 11,791,137 | B2 * | 10/2023 | Lee | ................... H01J 37/32642 |
| | | | | 156/345.48 |

| | | | | |
|---|---|---|---|---|
| 2003/0003608 | A1 * | 1/2003 | Arikado | ................ H01L 23/544 |
| | | | | 257/E23.179 |
| 2006/0131696 | A1 * | 6/2006 | Arikado | ................ H01L 23/544 |
| | | | | 257/679 |
| 2009/0134500 | A1 * | 5/2009 | Kuo | ........................ H01L 23/66 |
| | | | | 257/659 |
| 2009/0311829 | A1 * | 12/2009 | Yang | ........................ H01L 24/94 |
| | | | | 438/626 |
| 2009/0325382 | A1 | 12/2009 | Yu et al. | |
| 2013/0285228 | A1 * | 10/2013 | Montez | ................... H01L 23/10 |
| | | | | 438/106 |
| 2014/0007901 | A1 | 1/2014 | Chen et al. | |
| 2014/0124889 | A1 * | 5/2014 | Qian | ..................... H10F 39/804 |
| | | | | 438/455 |
| 2015/0099365 | A1 * | 4/2015 | Chen | ................. H01J 37/32091 |
| | | | | 156/345.24 |
| 2015/0194455 | A1 * | 7/2015 | Ho | ......................... H01L 23/585 |
| | | | | 438/109 |
| 2016/0093591 | A1 * | 3/2016 | Lan | ...................... H10D 84/038 |
| | | | | 438/107 |
| 2020/0006145 | A1 * | 1/2020 | Li | ........................ H01L 25/0655 |
| 2021/0066386 | A1 * | 3/2021 | Lee | ................... H01J 37/32642 |
| 2023/0215692 | A1 * | 7/2023 | Hua | ................... H01J 37/32385 |
| | | | | 438/798 |
| 2023/0275064 | A1 * | 8/2023 | Li | ..................... H01L 21/02164 |
| | | | | 438/107 |
| 2023/0352278 | A1 * | 11/2023 | Hua | ................... H01J 37/32642 |
| 2023/0402257 | A1 * | 12/2023 | Chen | ................. H01L 21/67069 |

FOREIGN PATENT DOCUMENTS

| | | | |
|---|---|---|---|
| KR | 20010040740 | A | 5/2001 |
| KR | 20080101331 | A | 11/2008 |
| WO | 0188970 | A1 | 11/2001 |

OTHER PUBLICATIONS

Notice of Allowance dated Feb. 10, 2023 for U.S. Appl. No. 17/197,254.

* cited by examiner

100

120

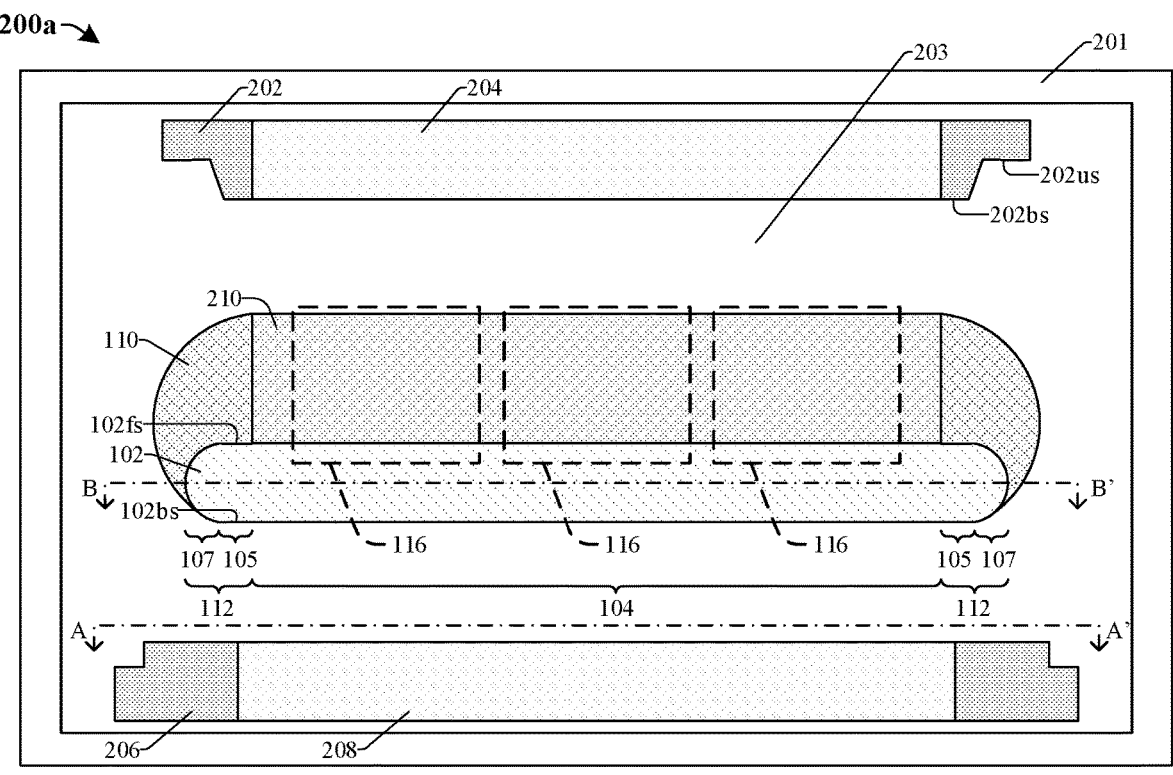
Fig. 2A
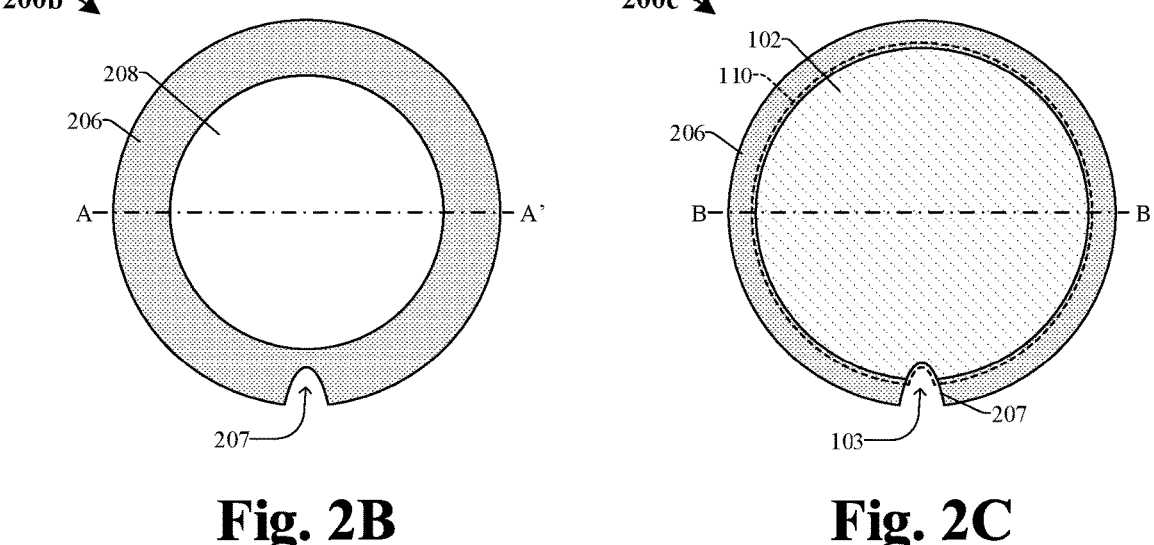
Fig. 2B                                    Fig. 2C

400a

400b

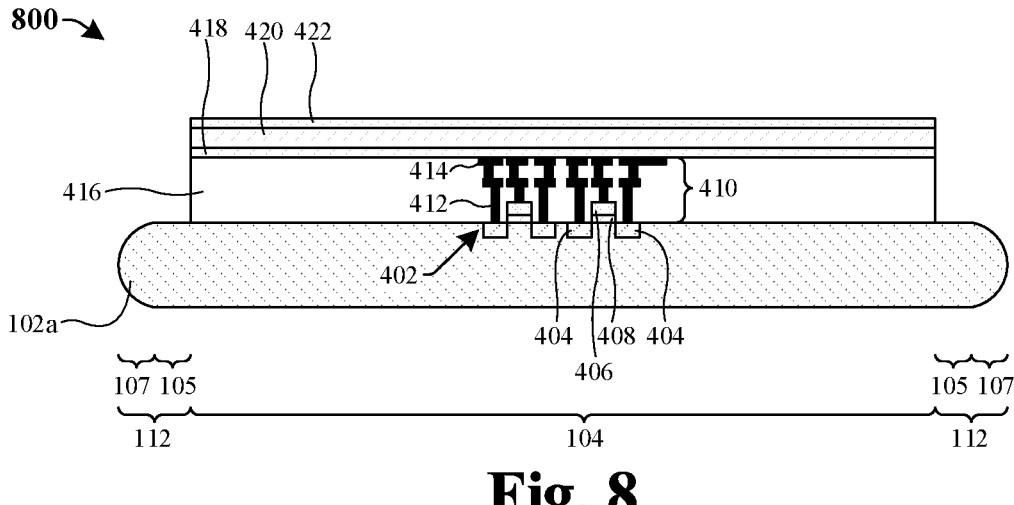
Fig. 8
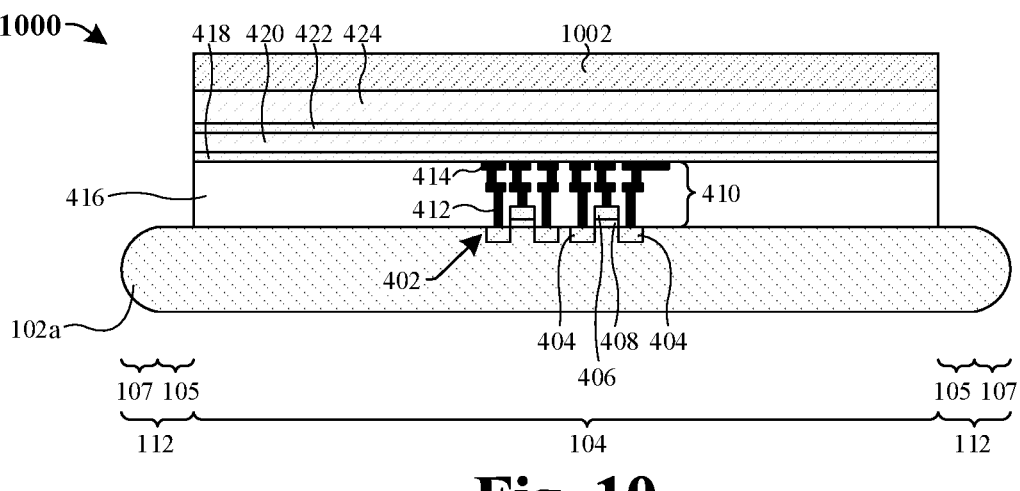
Fig. 9
Fig. 10

Fig. 12B            Fig. 12C

1800

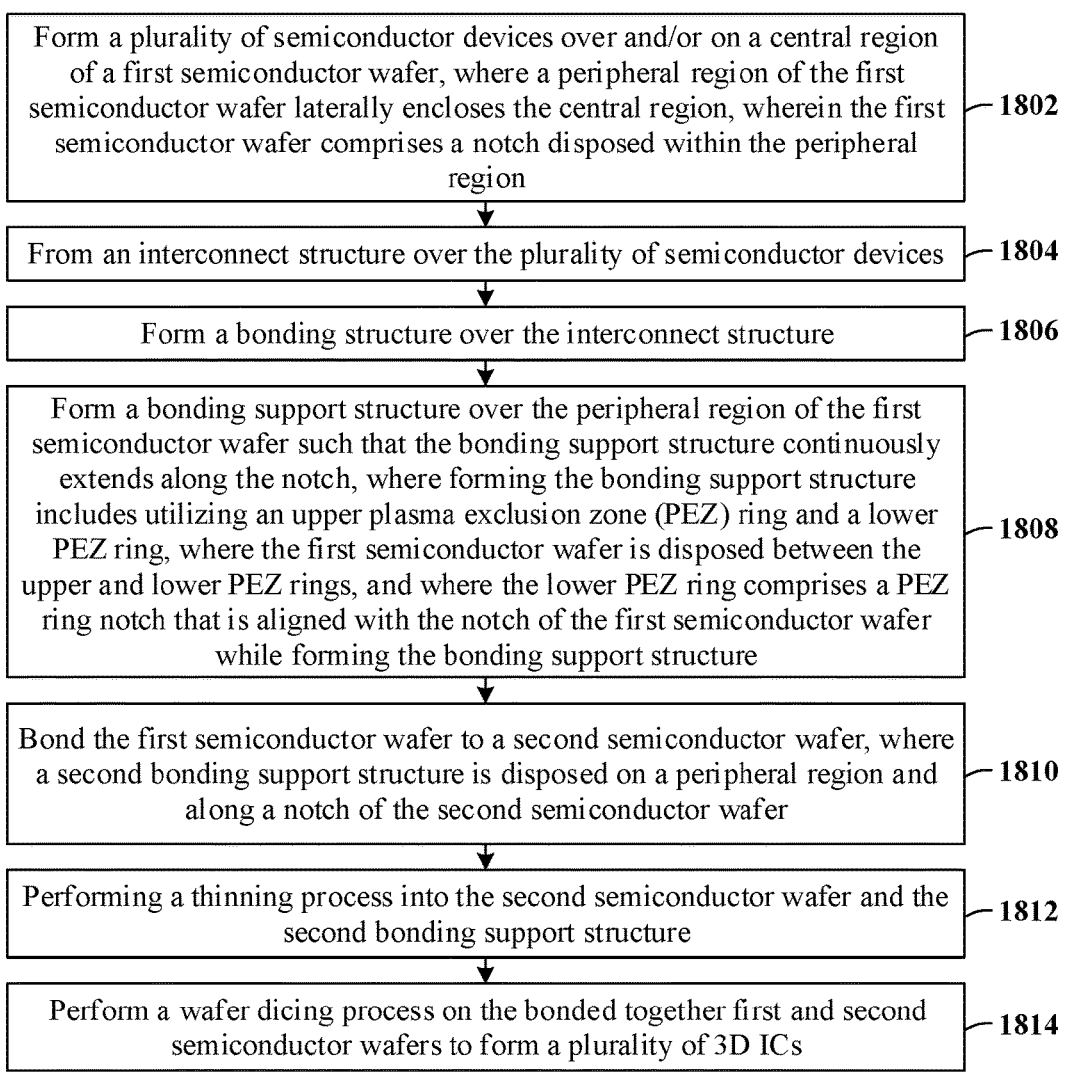

Form a plurality of semiconductor devices over and/or on a central region of a first semiconductor wafer, where a peripheral region of the first semiconductor wafer laterally encloses the central region, wherein the first semiconductor wafer comprises a notch disposed within the peripheral region ⟶ 1802

From an interconnect structure over the plurality of semiconductor devices ⟶ 1804

Form a bonding structure over the interconnect structure ⟶ 1806

Form a bonding support structure over the peripheral region of the first semiconductor wafer such that the bonding support structure continuously extends along the notch, where forming the bonding support structure includes utilizing an upper plasma exclusion zone (PEZ) ring and a lower PEZ ring, where the first semiconductor wafer is disposed between the upper and lower PEZ rings, and where the lower PEZ ring comprises a PEZ ring notch that is aligned with the notch of the first semiconductor wafer while forming the bonding support structure ⟶ 1808

Bond the first semiconductor wafer to a second semiconductor wafer, where a second bonding support structure is disposed on a peripheral region and along a notch of the second semiconductor wafer ⟶ 1810

Performing a thinning process into the second semiconductor wafer and the second bonding support structure ⟶ 1812

Perform a wafer dicing process on the bonded together first and second semiconductor wafers to form a plurality of 3D ICs ⟶ 1814

Fig. 18

NOTCHED WAFER AND BONDING SUPPORT STRUCTURE TO IMPROVE WAFER STACKING

REFERENCE TO RELATED APPLICATION

This Application is a Divisional of U.S. application Ser. No. 17/197,254, filed on Mar. 10, 2021, the contents of which are hereby incorporated by reference in their entirety.

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-C illustrate a cross-sectional view and top views of some embodiments of a semiconductor wafer and a processing tool having an upper plasma exclusion zone (PEZ) ring and a lower PEZ ring that comprises a PEZ ring notch.

FIGS. 5-17 illustrate cross-sectional views of some embodiments of a method of forming bonding support structures along and/or over notches of a first semiconductor wafer and a second semiconductor wafer, respectively, and bonding the first semiconductor wafer to the second semiconductor wafer.

FIG. 18 illustrates a methodology in flowchart format that illustrates some embodiments of forming bonding support structures along and/or over notches of a first semiconductor wafer and a second semiconductor wafer, respectively, and bonding the first semiconductor wafer to the second semiconductor wafer.

DETAILED DESCRIPTION

Figure 1A:
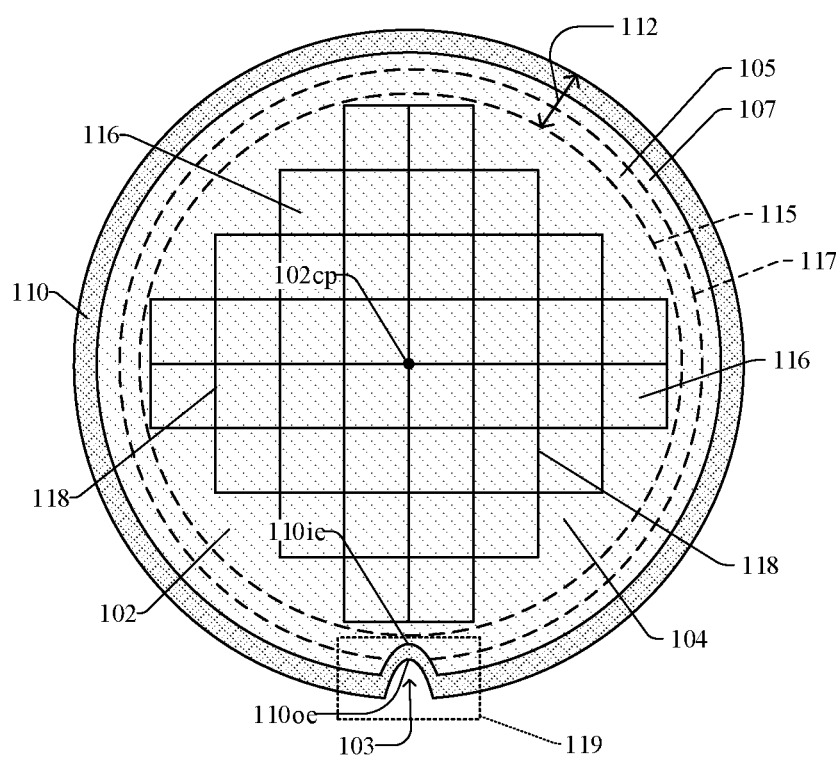
FIG. 1A illustrates some embodiments of a top view of an integrated chip including a plurality of two-dimensional (2D) integrated circuits (ICs) overlying a semiconductor wafer with a notch and a bonding support structure surrounding a circumferential edge of the semiconductor wafer and extending continuously along the notch.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

A three-dimensional (3D) integrated circuit (IC) comprises a plurality of integrated chip die that are stacked and bonded together. One possible method to manufacture a 3D IC includes a wafer stacking method that comprises bonding a first semiconductor wafer to a second semiconductor wafer. In such a method, a plurality of first 2D ICs are disposed on a central region of the first semiconductor wafer, and a first bonding structure is disposed over the plurality of first 2D ICs. A plurality of second 2D ICs are disposed on the second semiconductor wafer, and a second bonding support structure is disposed over the plurality of second 2D ICs. Further, first and second bonding support structure are disposed over a peripheral region of the first and second semiconductor wafers, respectively. The first bonding support structure and the second bonding support structure may be stacked on one another and bonded together (e.g., via eutectic bonding, hybrid bonding, etc.), such that a plurality of 3D ICs are formed, each of which comprise a first 2D IC electrically coupled to a second 2D IC. Subsequently, a thinning process (e.g., chemical mechanical planarization (CMP)) is performed on the second semiconductor wafer and the second bonding support structure. A plurality of through-substrate vias (TSVs) are formed in the second semiconductor wafer to provide electrical connections to the plurality of 3D ICs. Finally, a wafer dicing process (e.g., mechanical sawing, laser cutting, etc.) may be performed on the bonded semiconductor wafers to form a plurality of separate 3D ICs.

One challenge with the above wafer stacking method is non-bond (NB) regions. NB regions are regions over the first semiconductor wafer and/or regions over the second semiconductor wafer that will not bond together during a bonding process (e.g., due to an upper surface of the first bonding structure and/or the first bonding support structure not being substantially planar between opposite edges of the first semiconductor wafer). For example, because semiconductor wafers typically have a rounded/bullet-shaped bevel region, NB regions exist over the peripheral region of the first semiconductor wafer and/or a peripheral region of the second semiconductor wafer.

Further, the first and/or second semiconductor wafers may each comprise a notch disposed in the peripheral region of the first and/or second semiconductor wafer. The notch is configured as an alignment mark for the first and/or second semiconductor wafers during processing steps (e.g., the bonding process, the dicing process, etc.). During deposition of the first bonding support structure, an upper plasma exclusion zone (PEZ) ring is disposed over a front-side of the first semiconductor wafer and a lower PEZ ring is disposed below a back-side of the first semiconductor wafer. The upper PEZ ring is configured to prevent deposition of the first bonding support structure over a central region of the first semiconductor wafer, where the peripheral region laterally encloses the central region. In addition, the lower PEZ ring is configured to prevent deposition of the first bonding support structure on the back-side of the first semiconductor wafer. The upper and lower PEZ rings are ring-shaped and/or circular. Because the notch is relatively close to the lower PEZ ring (e.g., within a range of about 0.2 to 5 millimeters (mm)) and the lower PEZ ring is circular in shape and/or devoid of a PEZ ring notch, the lower PEZ ring may block and/or mitigate deposition of the first bonding support structure on/around the notch of the first semiconductor wafer. Thus, a thickness of the first bonding support structure around/over the notch of the first semiconductor wafer is substantially less (e.g., at least 10,000 angstroms less) than a thickness of the first bonding support structure over the first semiconductor wafer on a side opposite to the notch. Therefore, the lower PEZ ring may prevent the first bonding support structure from being deposited around an entire inner surface of the notch, thereby decreasing the thickness of the first bonding support structure around the notch. Thus, a NB region may exist around at least a portion of the notch of the first semiconductor wafer.

Further, due to the reduced deposition of the first bonding support structure, a substantially large step height (e.g., a step height with an absolute value between about 10,000 to 30,000 angstroms) may exist between the first bonding support structure over the notch and the first bonding support structure on a side opposite to the notch. The substantially large step height may cause step height issues (e.g., chipping, cracking, etc. during subsequent thinning processes and/or increased NB regions) between the first and second semiconductor wafers and the first and second bonding support structures. The step height issues may reduce a structural integrity of the first and/or second semiconductor wafers.

In various embodiments, the present application is directed towards a method of bonding together a first semiconductor wafer and a second semiconductor wafer to reduce NB regions of the first and second semiconductor wafers. The method includes providing a first semiconductor wafer with a notch located in a peripheral region of the first semiconductor wafer. A first bonding support structure is formed over the peripheral region of the first semiconductor wafer such that the first bonding support structure continuously extends along/over the notch. During formation of the first bonding support structure, an upper PEZ ring is disposed over a front-side of the first semiconductor wafer and a lower PEZ ring is disposed below a back-side of the first semiconductor wafer. The lower PEZ ring comprises a PEZ ring notch that has a similar and/or same shape/size as the notch in the first semiconductor wafer. As the first bonding support structure is deposited on the peripheral region of the first semiconductor wafer, the PEZ ring notch is aligned with the notch in the first semiconductor wafer such that the lower PEZ ring may not bock deposition of the first bonding support structure along the notch in the first semiconductor wafer. This, in part, ensures the first bonding support structure extends continuously along the notch of the first semiconductor wafer. Further, a step height between the first bonding support structure over the notch and the first bonding support structure on a side opposite to the notch is substantially small (e.g., an absolute value less than about 10,000 angstroms). In addition, a second bonding support structure may be formed over the second semiconductor wafer (the second bonding support structure is formed in a same manner as the first bonding support structure), such that a step height between the second bonding support structure over the notch and the second bonding support structure on a side opposite to the notch is substantially small (e.g., an absolute value less than about 10,000 angstroms). Subsequently, the first semiconductor wafer is bonded to the second semiconductor wafer. By reducing the step height of the first and second bonding support structures, step height issues between the first and second semiconductor wafers and the first and second bonding support structures may be mitigated. This increases an endurance and structural integrity of the first and second semiconductor wafers, and increases a yield of the 3D ICs FIG. 1A illustrates a top view of some embodiments of an integrated chip 100 including a plurality of two-dimensional (2D) integrated circuits (ICs) 116 overlying a semiconductor wafer 102 comprising a notch 103, and a bonding support structure 110 disposed over a peripheral region 112 of the semiconductor wafer 102.

The semiconductor wafer 102 includes a central region 104 that is laterally surrounded by a peripheral region 112. A plurality of two-dimensional (2D) integrated circuits (ICs) 116 are disposed on the semiconductor wafer 102 and are separated from one another by scribe lines 118. The semiconductor wafer 102 may be subsequently singulated (e.g., cut or diced) into individual dies and/or individual 2D ICs along the scribe lines 118. For simplicity and clarity, in FIG. 1A, only two 2D ICs 116 and two scribe lines 118 have been labeled, but it will be appreciated that additional dies and scribe lines are also present. Each 2D IC 116 includes functional circuitry, typically including semiconductor devices, such as diodes, resistors, capacitors, memory cells, and/or transistors (e.g., metal oxide semiconductor field effect transistors (MOSFETs), bipolar junction transistors (BJTs), fin field effect transistors (FINFETs), etc.). The scribe lines 118 may be devoid of functional circuitry and/or may include test structures or test circuits, which are typically removed via singulation prior to the final integrated circuits being diced and sold.

In some embodiments, an outer perimeter of the central region 104 is defined by an IC region edge 115, in which the plurality of 2D ICs 116 are spaced laterally within the IC region edge 115. Further, the peripheral region 112 laterally encloses the central region 104 of the semiconductor wafer 102 and is defined between the IC region edge 115 and a circumferential edge of the semiconductor wafer 102. In some embodiments, the peripheral region 112 may be referred to as an IC-less region, in which the plurality of 2D ICs 116 are laterally offset from the peripheral region 112 by one or more non-zero distances. In some embodiments, the peripheral region 112 comprises an inner peripheral region 105 and a bevel region 107. The inner peripheral region 105 separates the bevel region 107 from the central region 104 of the semiconductor wafer 102. In some embodiments, the outer edges of the semiconductor wafer 102 have a rounded profile, a bullet-shaped profile, another suitable shape and/or profile, or the like. In further embodiments, the rounded and/or bullet-shaped profile of the outer edges of the semiconductor wafer 102 is disposed within the bevel region 107. Further, the inner peripheral region 105 may be defined between the IC region edge 115 and a bevel region edge 117. Furthermore, the bevel region 107 may be defined between the bevel region edge 117 and the circumferential edge of the semiconductor wafer 102.

The circumferential edge of the semiconductor wafer 102 is circular but for the presence of a notch 103. The notch 103 is disposed at a location along the circumferential edge of the semiconductor wafer 102. The notch 103 extends inwardly from the circumferential edge of the semiconductor wafer 102 by a notch radial distance. In some embodiments, the notch radial distance is less than about 10% of a wafer radius as measured from a center point 102$cp$ of the semiconductor wafer 102 to the circumferential edge of the semiconductor wafer 102, or another suitable value. In some embodiments, the notch 103 has a rounded edge with an innermost curved region of the rounded etch corresponding to the innermost point (e.g., rounded shape), while in other embodiments the notch 103 has two linear or planar surfaces (not shown) that meet at a point (e.g., see FIG. 1B). It will be appreciated that the notch 103 having another shape and/or profile is also within the scope of the disclosure. In yet further embodiments, the notch 103 of the semiconductor wafer 102 may be used as an alignment mark and/or an alignment notch to orientate and/or align the semiconductor wafer 102 during different processing steps (e.g., a bonding process, a thinning process, a singulation process, another suitable process, etc.) and/or another process.

A bonding support structure 110 is disposed over the semiconductor wafer 102. The bonding support structure 110 is disposed over and within the peripheral region 112 of the semiconductor wafer 102. In further embodiments, the bonding support structure 110 continuously laterally extends from the bevel region edge 117 to the circumferential edge of the semiconductor wafer 102 (not shown). In yet further embodiments, the bonding support structure 110 continuously laterally extends from the IC region edge 115 to the circumferential edge of the semiconductor wafer 102 (not shown). In some embodiments, the bonding support structure 110 comprises a layer of dielectric material (e.g., an oxide, a nitride, an oxynitride, another dielectric material, or any combination of the foregoing) that extends around the circumferential edge of the semiconductor wafer 102 as a ring. By forming the bonding support structure 110 over the peripheral region 112 of the semiconductor wafer 102, the bonding support structure 110 is able to increase a height of the peripheral region 112 to be substantially equal to a height of the central region 104 of the semiconductor wafer 102. By increasing a height of the peripheral regions 112, the bonding support structure 110 is configured to reduce non-bond (NB) regions over the peripheral region 112 of the semiconductor wafer 102.

In addition, during formation of the bonding support structure 110, an upper plasma exclusion zone (PEZ) ring (not shown) is disposed over a front-side of the semiconductor wafer 102 and a lower PEZ ring (not shown) is disposed below a back-side of the semiconductor wafer 102. The lower PEZ ring comprises a PEZ ring notch that has a similar and/or same shape/size as the notch 103 in the semiconductor wafer 102. In some embodiments, the upper PEZ ring is configured to prevent deposition of the bonding support structure 110 over the central region 104 of the semiconductor wafer 102, and the lower PEZ ring is configured to prevent deposition of the bonding structure on the back-side of the semiconductor wafer 102. As the bonding support structure 110 is deposited on the semiconductor wafer 102, the PEZ ring notch is aligned with the notch 103 in the semiconductor wafer 102 such that the lower PEZ ring may not bock deposition of the bonding support structure 110 along/around the notch 103. Thus, the bonding support structure 110 continuously extends along an outer surface of the notch 103 and the bonding support structure 110 directly overlies the notch 103. Further, by virtue of the PEZ ring notch in the lower PEZ ring, a step height of the bonding support structure 110 around the notch 103 is reduced. For example, a step height difference of the bonding support structure 110 may be present between an inner edge 110$ie$ of the bonding support structure 110 and an outer edge 110$oe$ of the bonding support structure. In some embodiments, the step height difference of the bonding support structure 110 around the notch 103 may be relatively low (e.g., an absolute value less than about 10,000 angstroms), thereby mitigating associated step height issues.

For example, by mitigating step height issues, a thinning process (e.g., a chemical mechanical planarization (CMP) process) may be performed into the semiconductor wafer 102 and/or the bonding support structure 110 with reduced damage (e.g., chipping, delamination, cracking, etc.) to the semiconductor wafer 102 and/or other layers or structures disposed on the semiconductor wafer 102. Further, the relatively low step height difference in the bonding support structure 110 around the notch 103 may reduce NB regions in the peripheral region 112, thereby increasing structural support when bonding the semiconductor wafer to another semiconductor wafer (not shown). Thus, by forming the bonding support structure 110 with a lower PEZ ring having a PEZ ring notch aligned with the notch 103, a structural integrity, endurance, and reliability of the integrated chip 100 may be increased.

Figure 1B:
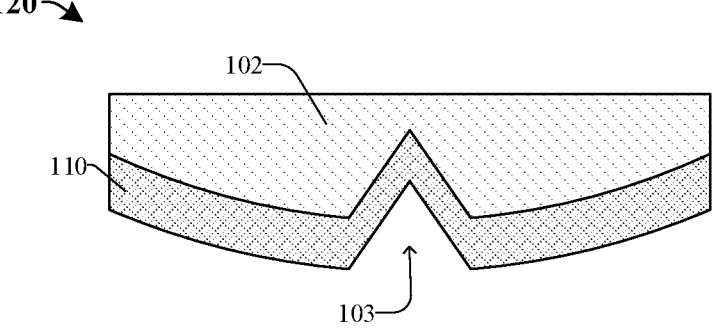
FIG. 1B illustrates some embodiments of a top view of a portion of the semiconductor wafer and the bonding support structure of FIG. 1A.

FIG. 1B illustrates a top view 120 of a portion of the semiconductor wafer 102 and the bonding support structure 110 taken from the dashed box 119 of FIG. 1A. As illustrated in FIG. 1B, in some embodiments, the notch 103 has two linear or planar surfaces that meet at a point and the bonding support structure 110 continuously extends along the two linear or planar surfaces of the notch 103.

FIG. 2A illustrates a cross-sectional view 200$a$ of some embodiments of a semiconductor wafer 102 disposed vertically between an upper plasma exclusion zone (PEZ) ring 202 and a lower PEZ ring 206. FIG. 2B illustrates a top view 200$b$ of some embodiments of the lower PEZ ring 206 and a lower plate 208 taken along the line A-A' of the cross-sectional view 200$a$ of FIG. 2A. Further, FIG. 2C illustrates a top view 200$c$ of some embodiments of the semiconductor wafer 102 taken along the line B-B' of the cross-sectional view 200$a$ of FIG. 2A.

The cross-sectional view 200$a$ illustrates some embodiments of a processing tool used to deposit the bonding support structure 110 on the semiconductor wafer 102. The processing tool includes the lower PEZ ring 206 and the upper PEZ ring 202 disposed within a vacuum chamber 203. Further, the processing tool includes a vacuum housing 201 that defines the vacuum chamber 203. The upper PEZ ring 202 laterally surrounds an upper plate 204 and the lower PEZ ring 206 laterally surrounds the lower plate 208. The semiconductor wafer 102 is disposed within the vacuum chamber 203 and is vertically spaced between the upper PEZ ring 202 and the lower PEZ ring 206. In some embodiments, the semiconductor wafer 102 may be held within the vacuum chamber 203 by a wafer chuck (not shown), such that the semiconductor wafer 102 is vertically separated from the lower PEZ ring 206 by a non-zero distance. Further, the semiconductor wafer 102 comprises a back-side surface 102*bs* opposite to a front-side surface 102*fs*. A semiconductor structure 210 is disposed over the front-side surface 102*fs* of the semiconductor wafer 102. The plurality of 2D ICs 116 are disposed within the semiconductor structure 210. In some embodiments, the semiconductor structure 210 comprises a plurality of semiconductor devices (e.g., diodes, resistors, capacitors, memory cells, transistors, other suitable devices, or any combination of the foregoing), a plurality of dielectric layers, and/or an interconnect structure. The semiconductor structure 210 is spaced laterally within the central region 104 of the semiconductor wafer 102.

The bonding support structure 110 is disposed over the semiconductor wafer 102 and laterally surrounds the semiconductor structure 210. In some embodiments, a deposition process (e.g., a chemical vapor deposition (CVD) process, plasma enhance CVD, etc.) utilized to form the bonding support structure 110 includes loading the semiconductor wafer 102 into the vacuum chamber 203. Subsequently, one or more processing gas(es) is/are flowed into the vacuum chamber 203, with the upper and lower PEZ rings 202, 206 in place, such that the bonding support structure 110 is selectively deposited over the peripheral region 112 of the semiconductor wafer 102. By virtue of a shape and/or position of the upper PEZ ring 202, the upper PEZ ring 202 is configured to prevent the deposition process from depositing the bonding support structure 110 over the central region 104 of the semiconductor wafer 102 and/or over the semiconductor structure 210. For example, the upper PEZ ring 202 comprises a tapered profile where a height of the upper PEZ ring 202 continuously decreases from a bottom surface 202*bs* of the upper PEZ ring 202 to an upper surface 202*us* of the upper PEZ ring 202. In such embodiments, the tapered profile facilitates deposition of the bonding support structure 110 within the peripheral region 112 of the semiconductor wafer 102 while preventing deposition within the central region 104. In some embodiments, the upper PEZ ring 202 is circular in shaped and/or devoid of a notch extending into the circumferential edge of the upper PEZ ring 202.

Further, during the deposition process, the lower PEZ ring 206 is disposed below the back-side surface 102*bs* of the semiconductor wafer 102 and is configured to prevent the deposition process from depositing the bonding support structure 110 on the back-side surface 102*bs*. Furthermore, as illustrated in the top view 200*b* of FIG. 2B, the lower PEZ ring 206 comprises a PEZ ring notch 207 that may have a shape that corresponds to the shape of the notch (103 of FIG. 1A) disposed within the peripheral region 112 of the semiconductor wafer 102. In alternative embodiments, the PEZ ring notch 207 has a shape and/or size than is different from the shape and/or size of the notch (103 of FIG. 1A) disposed within the peripheral region 112 of the semiconductor wafer 102. Further, as illustrated in the top view 200*c* of FIG. 2C, during the deposition process, the PEZ ring notch 207 is aligned with the notch 103 of the semiconductor wafer 102. This, in part, ensures that the bonding support structure 110 is disposed continuously along the notch 103 of the semiconductor wafer 102 and decreases a step height of the bonding support structure 110 around the notch 103. This may decrease non-bond (NB) regions around the notch 103 and/or may mitigate step height issues during subsequent processing steps (e.g., a thinning process). In yet further embodiments, before performing the deposition process, an alignment process is performed to ensure that the PEZ ring notch 207 directly underlies the notch 103 of the semiconductor wafer 102. It will be appreciated that the bonding support structure 110 is represented by a dashed line in the top view 200*c* of FIG. 2C for ease of illustration of the PEZ ring notch 207 being aligned with the notch 103 of the semiconductor wafer 102. In yet further embodiments, if the notch 103 comprises two linear or planar surfaces that meet at a point (see FIG. 2B), then the PEZ ring notch 207 comprises two linear or planar surfaces that meet at a point (not shown) that corresponds to a shape and/or size of the notch 103. In some embodiments, the upper PEZ ring 202 and the lower PEZ ring 206 comprise a same material such as, for example, yttrium oxide (e.g., $Y_2O_3$) or another suitable material.

Figure 3A:
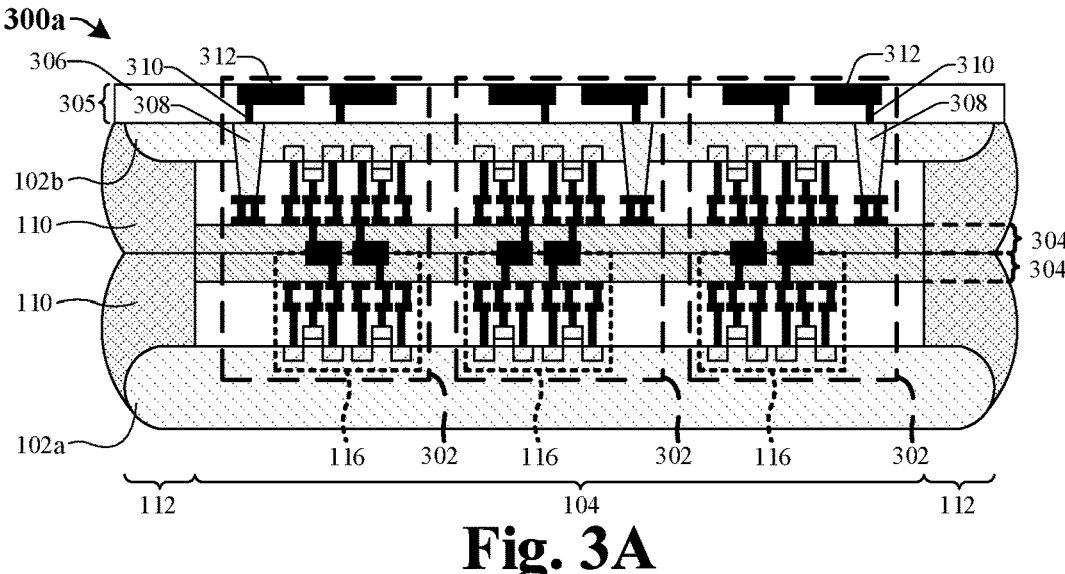
FIGS. 3A-3C illustrate cross-sectional views of some embodiments of a first semiconductor wafer bonded to a second semiconductor wafer, each having a bonding support structure disposed along a peripheral region.

FIG. 3A illustrates a cross-sectional view 300*a* of some embodiments of a first semiconductor wafer 102*a* bonded to a second semiconductor wafer 102*b* such that a plurality of three-dimensional (3D) integrated circuits (ICs) 302 are disposed between the first and second semiconductor wafers 102*a-b*.

A plurality of 2D ICs 116 are disposed on each of the semiconductor wafers 102*a-b*. In some embodiments, the 2D ICs 116 are disposed in/over central regions 104 of the first and second semiconductor wafers 102*a-b*, respectively. Further, bonding structures 304 are disposed between the first and second semiconductor wafers 102*a-b*. In some embodiments, the bonding structures 304 are laterally spaced within the central regions 104 of the first and second semiconductor wafers 102*a-b*, respectively.

Bonding support structures 110 are disposed around/on a peripheral region 112 of the first and second semiconductor wafers 102*a-b*, respectively. In some embodiments, the first and second semiconductor wafers 102*a-b* are each configured as the semiconductor wafer 102 of FIG. 1A such that the first and second semiconductor wafers 102*a-b* comprise a notch (103 of FIG. 1A). In further embodiments, the notch of the first semiconductor wafer 102*a* is aligned with the notch of the second semiconductor wafer 102*b* (not shown). In yet further embodiments, the bonding support structures 110 continuously extend along a surface of the notch of the first and second semiconductor wafers 102*a-b*, respectively. In some embodiments, the bonding support structures 110 respectively comprises one or more layers of a dielectric material (e.g., an oxide, a nitride, or the like).

An input/output (I/O) structure 305 is disposed over the second semiconductor wafer 102*b*. In some embodiments, the I/O structure 305 comprises a plurality of upper contacts 312 (e.g., contact pads, solder bumps, etc.) that directly overlie a corresponding upper contact via 310 that are disposed within/over an upper dielectric structure 306. The upper contact vias 310 are directly electrically coupled to a through-substrate via (TSV) 308. The TSVs 308 are disposed within the second semiconductor wafer 102*b* and are electrically coupled to semiconductor devices disposed within the plurality of 3D ICs 302 by way of conductive interconnect layers disposed within an interconnect structure. The I/O structure 305 is configured to provide electrical connections to the 3D ICs 302 and their respective semiconductor package. This, in part, may facilitate each 3D IC 302 being electrically coupled to another IC (not shown).

In some embodiments, before bonding the first semiconductor wafer 102a to the second semiconductor wafer 102b, a first thinning process (e.g., a CMP process, a mechanical grinding process, etc.) is performed on the bonding structures 304 and/or the bonding support structures 110. After the first thinning process, the bonding structures 304 and/or the bonding support structures 110 may have a substantially flat upper surface to facilitate a good bond between the first and second semiconductor wafers 102a-b. By virtue of the bonding support structures 110 being formed with a lower PEZ ring (206 of FIG. 2A) that comprises a PEZ ring notch (207 of FIG. 2B) (e.g., see FIGS. 2A-C), damage to the bonding support structures 110, the bonding structures 304, and/or the first and/or second semiconductor wafers 102a-b during the first thinning process is reduced. This is because a step height of the bonding support structures 110 around the notch (103 of FIG. 1A) of the first and/or second semiconductor wafers 102a-b is reduced. In addition, by virtue of the step height of the bonding support structures 110 being reduced, non-bond (NB) regions in the peripheral regions 112 of the first and second semiconductor wafers 102a-b may be reduced. This, in part, increases a strength of the bond between the first and second semiconductor wafers 102a-b, thereby increasing a structural integrity, endurance, and reliability of the plurality of 3D ICs 302.

In further embodiments, before forming the I/O structure 305 over the second semiconductor wafer 102b, a second thinning process (e.g., a CMP process) may be performed on the second semiconductor wafer 102b and the corresponding bonding support structure 110. By virtue of the step height of the bonding support structure 110 being reduced around the notch of the second semiconductor wafer 102b during the deposition process (e.g., as illustrated and/or described in FIGS. 2A-C), damage (e.g., cracking, delamination, etc.) to the second semiconductor wafer 102b and the bonding support structure 110 may be mitigated. This, in turn, increases a yield of the plurality of 3D ICs 302.

Figure 3B:
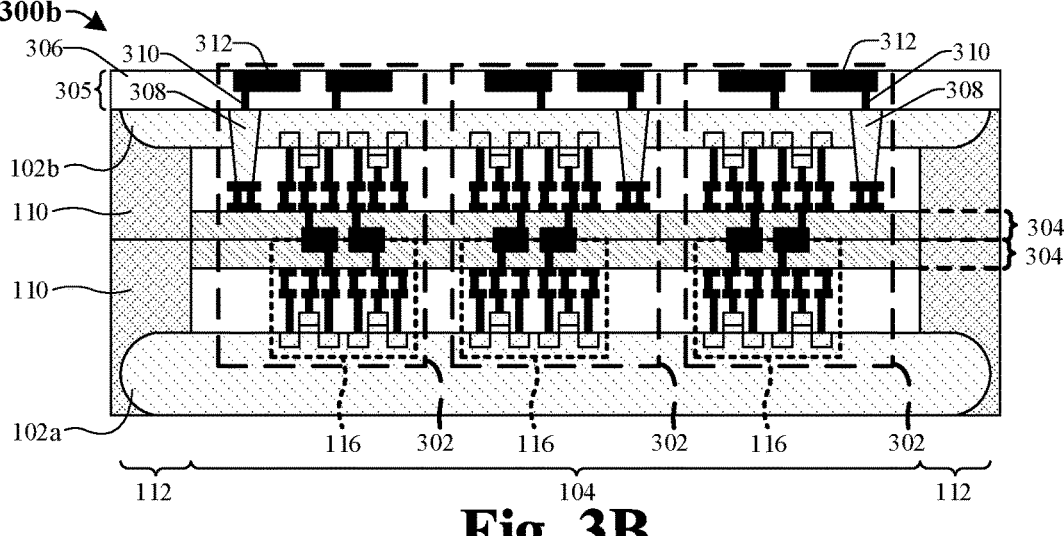

FIG. 3B illustrates a cross-sectional view 300b of some alternative embodiments of the first and second semiconductor wafers 102a-b of FIG. 3A, in which outer sidewalls of the bonding support structures 110 are substantially straight and/or aligned with outer sidewalls of the upper dielectric structure 306. In some embodiments, a bonding support structure 110 directly overlying the first semiconductor wafer 102a wraps around a beveled edge of the first semiconductor wafer 102a.

Figure 3C:
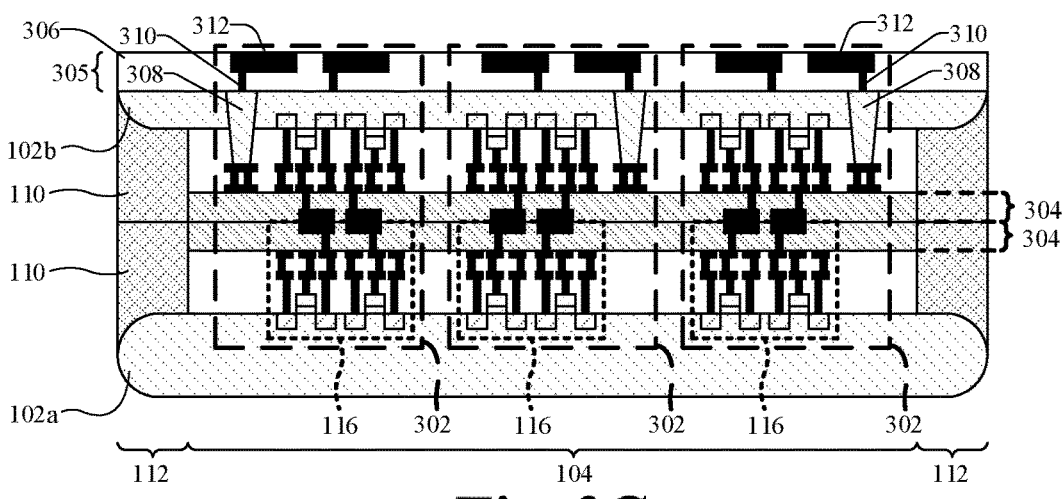

FIG. 3C illustrates a cross-sectional view 300c of some alternative embodiments of the first and second semiconductor wafers 102a-b of FIG. 3A, in which outer sidewalls of the bonding support structures 110 are substantially straight and/or aligned with outer sidewalls of the upper dielectric structure 306. In some embodiments, the outer sidewalls of the bonding support structures 110 are aligned with outer sidewalls of the first semiconductor wafer 102a and outer sidewalls of the second semiconductor wafer 102b.

Figure 4A:
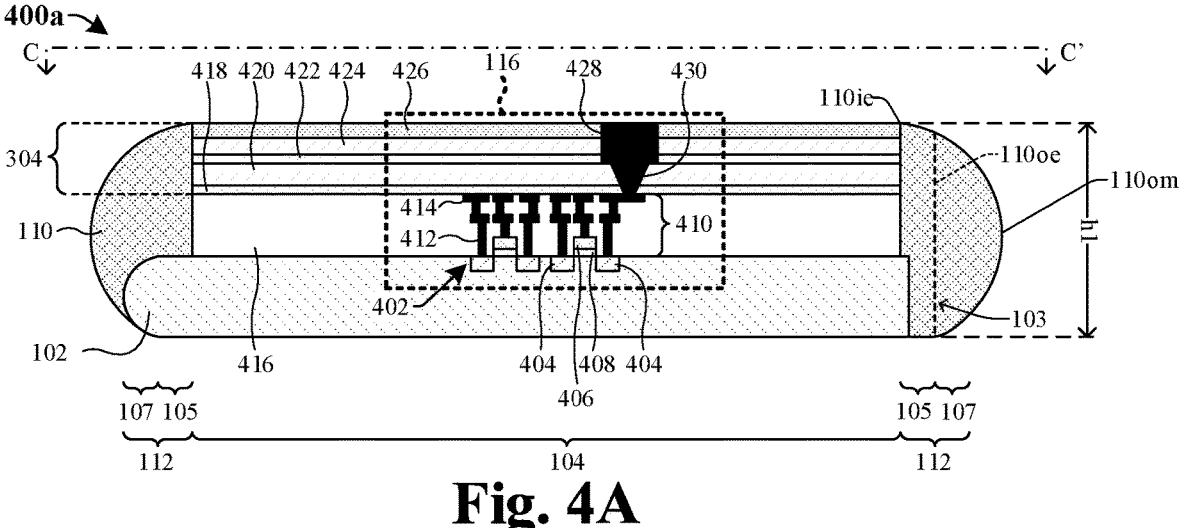
FIGS. 4A-B illustrate some embodiments of a cross-sectional view and a top view, respectively, of some more detailed embodiments of at least one of the semiconductor wafers of FIGS. 3A-C.
Figure 4B:
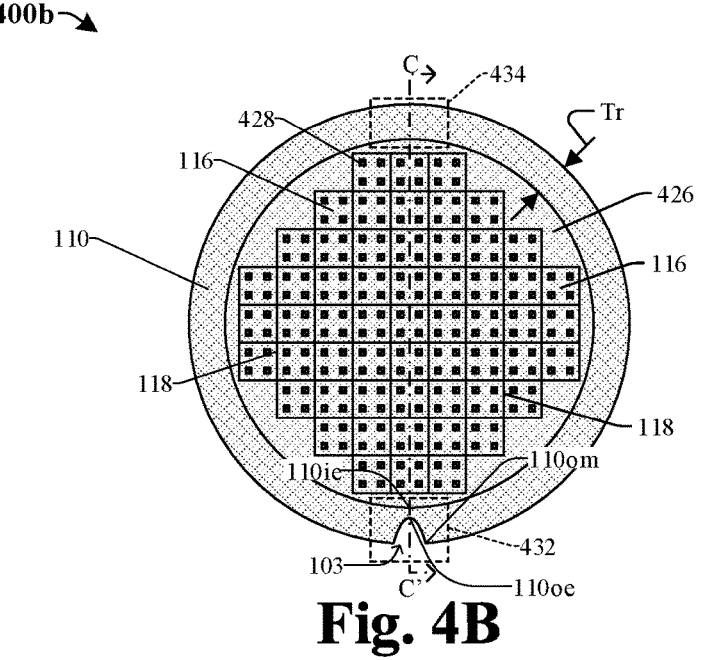

FIGS. 4A-B illustrate a cross-sectional view 400a and top view 400b, respectively, of some more detailed embodiments of at least one of the semiconductor wafers of FIGS. 3A-C. While FIG. 4A illustrates a single 2D IC 116 disposed over the semiconductor wafer 102, it will be appreciated that the 2D IC 116 may be one of a plurality of 2D ICs (see, e.g., FIGS. 1A, 3A-3C, and/or 4B). FIG. 4A illustrates the cross-sectional view 400a of some embodiments of the semiconductor wafer 102 taken along the line C-C' of the top view 400b of FIG. 4B.

As illustrated in FIG. 4A, a 2D IC 116 comprises a plurality of semiconductor devices 402 (e.g., transistors). In some embodiments, each of the semiconductor devices 402 comprise a pair of source/drain regions 404 disposed in the semiconductor wafer 102. In such embodiments, each of the semiconductor devices 402 comprise a gate electrode 406 stacked on a gate dielectric 408 and disposed between the source/drain regions 404. In further embodiments, the semiconductor wafer 102 comprises any type of semiconductor body (e.g., monocrystalline silicon/CMOS bulk, silicon-germanium (SiGe), silicon on insulator (SOI), etc.).

An interconnect structure 410 is disposed over the semiconductor wafer 102 and the semiconductor devices 402. The interconnect structure 410 comprises a plurality of conductive vias 412 and a plurality of conductive wires 414 disposed in a plurality of stacked inter-level dielectric (ILD) layers 416. The interconnect structure 410 is configured to provide electrical connections between various semiconductor devices 402 to form electrical circuits for the 2D IC 116. In some embodiments, the interconnect structure 410 may be disposed over the central region 104 of the semiconductor wafer 102 and is laterally separated from outermost edges of the semiconductor wafer 102 by non-zero distances.

In some embodiments, the plurality of stacked ILD layers 416 may comprise one or more of a low-k dielectric layer (e.g., a dielectric with a dielectric constant less than about 3.9), an ultra-low-k dielectric layer, an oxide (e.g., silicon dioxide), another dielectric material, or any combination of the foregoing. In further embodiments, the plurality of conductive vias 412 and/or the plurality of conductive wires 414 may, for example, be or comprise tungsten, copper, titanium nitride, ruthenium, tantalum nitride, aluminum, another conductive material, or any combination of the foregoing. In further embodiments, the plurality of stacked ILD layers 416 may be disposed over the central region 104 of the semiconductor wafer 102 and is laterally separated from the outermost edges of the semiconductor wafer 102 by non-zero distances.

A bonding structure 304 is disposed over the interconnect structure 410. In some embodiments, the bonding structure 304 comprises a first etch stop layer 418 disposed on the plurality of stacked ILD layers 416 and uppermost conductive wires 414 (e.g., an uppermost conductive line). In further embodiments, the first etch stop layer 418 is a different material than the plurality of stacked ILD layers 416 and may comprise, for example, silicon nitride, silicon carbide, silicon oxynitride, another dielectric material, or any combination of the foregoing. In further embodiments, the first etch stop layer 418 may have a substantially planar upper surface. In addition, in some embodiments, the bonding structure 304 may be disposed over the central region 104 of the semiconductor wafer 102 and is laterally separated from outermost edges of the semiconductor wafer 102 by non-zero distances.

In some embodiments, a bonding structure dielectric layer 420 is disposed on the first etch stop layer 418. In further embodiments, the bonding structure dielectric layer 420 is a different material than the first etch stop layer 418 and may comprise, for example, an oxide (e.g., silicon dioxide), a low-k dielectric material, an ultra-low-k dielectric material, another dielectric material, or any combination of the foregoing. In further embodiments, the bonding structure dielectric layer 420 may comprise the same material as the plurality of stacked ILD layers 416. In other embodiments, the bonding structure dielectric layer 420 may comprise a different material than the plurality of stacked ILD layers 416. In further embodiments, the bonding structure dielectric layer 420 may have a substantially planar upper surface.

In some embodiments, a second etch stop layer 422 is disposed on the bonding structure dielectric layer 420. In further embodiments, the second etch stop layer 422 is a different material than the bonding structure dielectric layer 420 and may comprise, for example, silicon nitride, silicon carbide, silicon oxynitride, another dielectric material, or any combination of the foregoing. In further embodiments, the second etch stop layer 422 may be the same material as the first etch stop layer 418. In yet further embodiments the second etch stop layer 422 may have a substantially planar upper surface.

In some embodiments, a redistribution dielectric layer 424 is disposed on the second etch stop layer 422. In further embodiments, the redistribution dielectric layer 424 is a different material than the second etch stop layer 422 and may comprise, for example, an oxide (e.g., silicon dioxide), a low-k dielectric material, an ultra-low-k dielectric material, another dielectric material, or any combination of the foregoing. In yet further embodiments, the redistribution dielectric layer 424 may have a substantially planar upper surface.

In some embodiments, a bonding interface dielectric layer 426 is disposed on the redistribution dielectric layer 424. In further embodiments, the bonding interface dielectric layer 426 is a different material than the redistribution dielectric layer 424 and may comprise, for example, silicon oxynitride, silicon nitride, silicon dioxide, another dielectric material, or any combination of the foregoing. In yet further embodiments, the bonding interface dielectric layer 426 may have a substantially planar upper surface.

Further, the bonding structure 304 comprises a conductive bonding link 428 and a conductive bonding via 430. In some embodiments, the conductive bonding link 428 extends from an upper surface of the bonding interface dielectric layer 426, through the bonding interface dielectric layer 426, through the redistribution dielectric layer 424, and through the second etch stop layer 422 to an upper surface of the bonding structure dielectric layer 420. In further embodiments, an upper surface of the conductive bonding link 428 is substantially planar with the upper surface of the bonding interface dielectric layer 426. In yet further embodiments, the conductive bonding link 428 may comprise, for example, copper, aluminum, tungsten, some other conductive material, or any combination of the foregoing. While FIG. 4A illustrates a single conductive bonding link 428, it will be appreciated that the bonding structure 304 may comprise multiple conductive bonding links.

The conductive bonding via 430 extends from the conductive bonding link 428 to the plurality of conductive wires 414, such that the conductive bonding link 428 is electrically coupled to the plurality of conductive vias 412 and the plurality of conductive wires 414. In some embodiments, the conductive bonding via 430 comprises for example, copper, aluminum, tungsten, some other conductive material, or any combination of the foregoing. Further, it will be appreciated that redistribution conductive lines (not shown) may be disposed in the redistribution dielectric layer 424, such that the conductive bonding via 430 and/or the conductive bonding link 428 may be disposed in different locations while still being electrically coupled to a conductive wire 414.

In some embodiments, a width (e.g., a distance between opposing sidewalls of the stack of plurality of stacked ILD layers 416) of the central region 104 of the semiconductor wafer 102 may be between about 92 percent of a width of the wafer 102 and about 99.8 percent of the width of the semiconductor wafer 102, or another suitable value. More specifically, in further embodiments, the width of the central region 104 of the semiconductor wafer 102 may be about 94 percent of the width of the semiconductor wafer 102. In further embodiments, a width of the peripheral region 112 (e.g., a distance between the central region 104 and a circumferential edge of the semiconductor wafer 102) may be between about 0.1 percent of the width of the semiconductor wafer 102 and about 4 percent of the width of the semiconductor wafer 102, or another suitable value. More specifically, in further embodiments, the width of the peripheral region 112 may be about 3 percent of the width of the semiconductor wafer 102, or another suitable value.

To prevent inadequate structural support when the semiconductor wafer 102 is bonded to another wafer (e.g., as shown in FIGS. 3A-C), a bonding support structure 110 is disposed on the semiconductor wafer 102. The bonding support structure 110 may comprise a layer of dielectric material arranged along opposing sides of the plurality of stacked ILD layers 416 over the peripheral region 112 of the semiconductor wafer 102. In some embodiments, the layer of dielectric material may extend from the semiconductor wafer 102 to an upper surface of the bonding structure 304. In other embodiments, the layer of dielectric material may have an upper surface above or below the upper surface of the bonding structure 304. The layer of dielectric material is devoid of conductive interconnect layers (e.g., interconnect wires and/or vias) and/or redistribution layers.

In some embodiments, the bonding support structure 110 extends laterally from opposite outer edges of the semiconductor wafer 102 to the central region 104 of the semiconductor wafer 102. In such embodiments, the bonding support structure 110 is disposed over the bevel region 107 and one of the inner peripheral regions 105. In some embodiments, the bonding support structure 110 extends vertically from an upper surface of the semiconductor wafer 102 along opposite sidewalls of the plurality of stacked ILD layers 416 and opposite sidewalls of the bonding structure 304. In further embodiments, the bonding support structure 110 may contact the semiconductor wafer 102, the plurality of stacked ILD layers 416, the first etch stop layer 418, the bonding structure dielectric layer 420, the second etch stop layer 422, the redistribution dielectric layer 424, and the bonding interface dielectric layer 426. In further embodiments, an upper surfaces of the bonding support structure 110 may be substantially planar with the upper surface of the bonding interface dielectric layer 426 and/or the conductive bonding link 428, such that the bonding structure 304 and the bonding support structure 110 provide a substantially planar upper surface between opposite edges of the semiconductor wafer 102. In further embodiments, outer sidewalls of the bonding support structure 110 may be substantially vertical (not shown).

In some embodiments, the bonding support structure 110 may comprise, for example, an oxide (e.g., SiO2), a nitride (e.g., SiN), an oxy-nitride (e.g., SiON), a carbide (e.g., silicon carbide (SiC)), some other dielectric, or any combination of the foregoing. In further embodiments, the bonding support structure 110 may have a height h1 (e.g., a distance from a bottom surface of a bonding support structure 110 to an upper surface of the bonding support structure 110) between about 200 angstrom and about 10 micrometers (μm), or another suitable value. In yet further embodiments, the height of the bonding support structure 110 may vary (e.g., by up to about 10,000 angstroms) across the width of the bonding support structure 110.

Further, as illustrated in the top view 400b of FIG. 4B, the circumferential edge of the semiconductor wafer 102 is circular but for the presence of a notch 103. The notch 103 is disposed at a location along the circumferential edge of the semiconductor wafer 102. The notch 103 extends inwardly from the circumferential edge of the semiconductor wafer 102 by a notch radial distance. In some embodiments, the notch radial distance is less than about 10% of a wafer radius as measured from a center point of the semiconductor wafer 102 to the circumferential edge of the semiconductor wafer 102. In some embodiments, the notch 103 has a rounded edge with an innermost curved region of the rounded etch corresponding to the innermost point (e.g., rounded shape), while in other embodiments the notch 103 has two linear or planar surfaces (not shown) that meet at a point (e.g., see FIG. 1B). In yet further embodiments, the notch 103 of the semiconductor wafer 102 may be used as an alignment mark and/or an alignment notch to orientate and/or align the semiconductor wafer 102 during different processing steps (e.g., a bonding process, a thinning process, a singulation process, another suitable process, or any combination of the foregoing) and/or another process.

The bonding support structure 110 continuously extends along a surface of the notch 103. In some embodiments, the height h1 may decrease from an inner edge 110ie of the bonding support structure 110 to an outer edge 110oe of the bonding support structure 110. With reference to the cross-sectional view 400a of FIG. 4A, the outer edge 110oe of the bonding support structure 110 is represented by a dashed line. In some embodiments, the outer edge 110oe is laterally closer to a sidewall of the semiconductor wafer 102 than an outermost edge 110om of the bonding support structure 110. By virtue of forming the bonding support structure 110 with a lower PEZ ring (not shown) comprising a PEZ ring notch (as illustrated and/or described in FIGS. 2A-C), a variation in the height h1 of the bonding support structure 110 around the notch 103 is relatively small (e.g., less than about 10,000 angstroms). This prevents damage (e.g., cracking) to the semiconductor wafer 102 and/or the bonding support structure 110 during a thinning process, thereby increasing a yield of the plurality of 2D ICs 116 disposed over/on the semiconductor wafer 102.

In some embodiments, the bonding support structure 110 corresponds to a ring-shaped bonding support structure 110. In further embodiments, the ring-shaped bonding support structure 110 may have a ring-shaped bonding support structure ring thickness Tr that is between about 0.1 percent of the diameter of the disk-shaped semiconductor wafer 102 and about 4 percent of the diameter of the disk-shaped semiconductor wafer 102, or another suitable value. More specifically, in further embodiments, the ring-shaped bonding support structure ring thickness Tr may be about 3 percent of the diameter of the disk-shaped semiconductor wafer 102.

In some embodiments, a first height of the bonding support structure 110 within a notch region 432 is less than a second height of the bonding support structure 110 within a first region 434 (not shown). In such embodiments, the first region 434 and the notch region 432 are disposed on opposing sides of the semiconductor wafer.

FIGS. 5-17 illustrate various views 500-1700 of some embodiments of a method for forming a bonding support structure around a semiconductor wafer comprising a notch and bonding the semiconductor wafer to another semiconductor wafer according to the present disclosure. Although the various views 500-1700 shown in FIGS. 5-17 are described with reference to a method, it will be appreciated that the structures shown in FIGS. 5-17 are not limited to the method but rather may stand alone separate of the method. Furthermore, although FIGS. 5-17 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
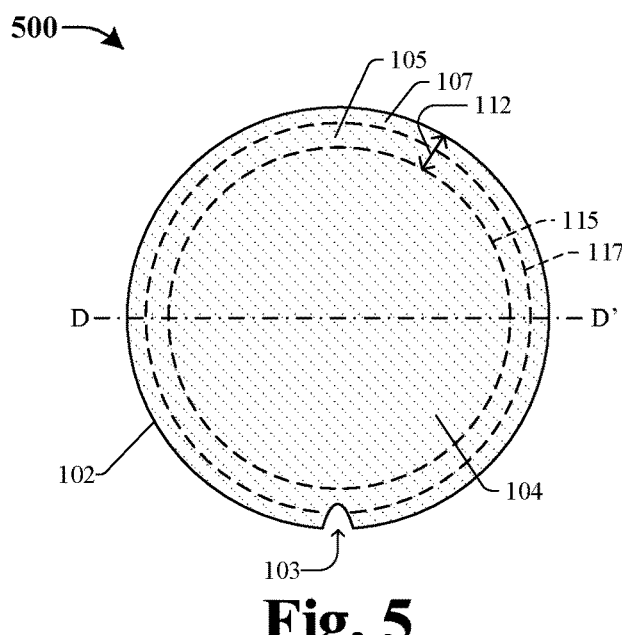

As shown in the top view 500 of FIG. 5, a first semiconductor wafer 102a is provided and comprises the notch 103 disposed within the peripheral region 112 of the first semiconductor wafer 102a. It will be appreciated that, in some embodiments, cross-sectional views of subsequent processing steps of the method of FIGS. 5-17 may be taken from the line D-D' of the top view 500 of FIG. 5.

Figure 6:
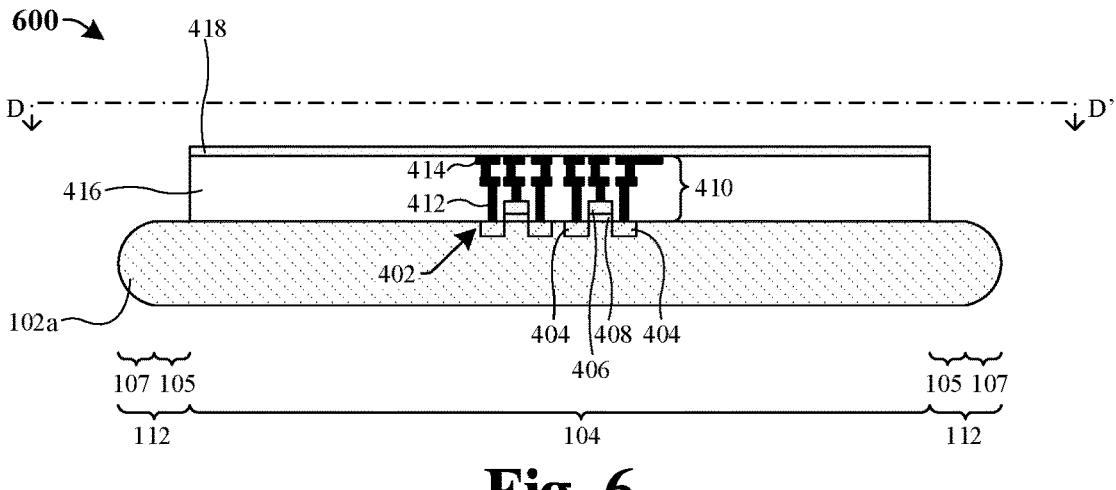

As shown in the cross-sectional view 600 of FIG. 6, a plurality of semiconductor devices 402, an interconnect structure 410, and a plurality of stacked ILD layers 416 are formed over/on the first semiconductor wafer 102a. Subsequently, a first etch stop layer 418 is formed on the plurality of stacked ILD layers 416 and on the plurality of conductive wires 414. In some embodiments, the first etch stop layer 418 is formed over the central region 104 of the first semiconductor wafer 102a. In further embodiments, the first etch stop layer 418 may be formed with sidewalls that are substantially aligned with sidewalls of the plurality of stacked ILD layers 416.

In some embodiments, a process for forming the first etch stop layer 418 may comprise depositing the first etch stop layer 418 on the plurality of stacked ILD layers 416 and the conductive wires 414. In further embodiments, the first etch stop layer 418 may be deposited by chemical vapor deposition (CVD), physical vapor deposition (PVD), atomic layer deposition (ALD), sputtering, some other deposition or growth process, or any combination of the foregoing. In further embodiments, a planarization process (e.g., a chemical mechanical planarization (CMP)) may be performed on the first etch stop layer 418 to planarize an upper surface of the first etch stop layer 418.

Figure 7:
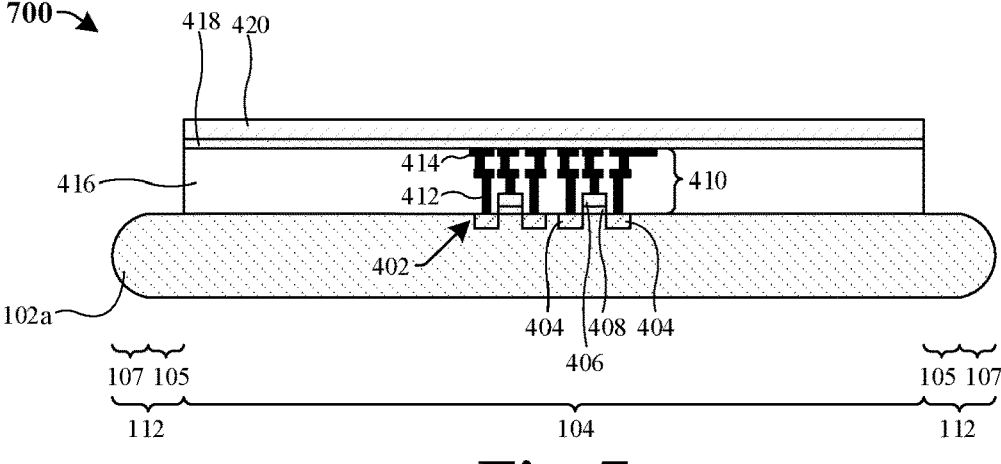

As shown in the cross-sectional view 700 of FIG. 7, a bonding structure dielectric layer 420 is formed on the first etch stop layer 418. In some embodiments, the bonding structure dielectric layer 420 is formed over the central region 104 of the first semiconductor wafer 102a. In further embodiments, the bonding structure dielectric layer 420 may be formed with sidewalls that are substantially aligned with sidewalls of the first etch stop layer 418.

In some embodiments, a process for forming the bonding structure dielectric layer 420 may comprise depositing or growing the bonding structure dielectric layer 420 on the first etch stop layer 418. In further embodiments, the bonding structure dielectric layer 420 may be deposited or grown by CVD, PVD, ALD, sputtering, thermal oxidation, some other deposition or growth process, or a combination of the foregoing. In further embodiments, a planarization process (e.g., CMP) may be performed on the bonding structure dielectric layer 420 to planarize an upper surface of the bonding structure dielectric layer 420.

As shown in the cross-sectional view 800 of FIG. 8, a second etch stop layer 422 is formed on the bonding structure dielectric layer 420. In some embodiments, the second etch stop layer 422 is formed over the central region 104 of the first semiconductor wafer 102a. In further embodiments, the second etch stop layer 422 may be formed with sidewalls that are substantially aligned with sidewalls of the bonding structure dielectric layer 420.

In some embodiments, a process for forming the second etch stop layer 422 may comprise depositing the second etch stop layer 422 on the bonding structure dielectric layer 420. In further embodiments, the second etch stop layer 422 may be deposited by CVD, PVD, ALD, sputtering, some other deposition or growth process, or any combination of the foregoing. In further embodiments, a planarization process (e.g., CMP) may be performed on the second etch stop layer 422 to planarize an upper surface of the second etch stop layer 422.

As shown in the cross-sectional view 900 of FIG. 9, a redistribution dielectric layer 424 is formed on the second etch stop layer 422. In some embodiments, the redistribution dielectric layer 424 is formed over the central region 104 of the first semiconductor wafer 102*a*. In further embodiments, the redistribution dielectric layer 424 may be formed with sidewalls that are substantially aligned with sidewalls of the second etch stop layer 422. In further embodiments, the redistribution dielectric layer 424 is a different material than the second etch stop layer 422 and may comprise, for example, an oxide (e.g., silicon dioxide), a low-k dielectric material, an ultra-low-k dielectric material, another dielectric material, or any combination of the foregoing.

In some embodiments, a process for forming the redistribution dielectric layer 424 may comprise depositing or growing the redistribution dielectric layer 424 on the second etch stop layer 422. In further embodiments, the redistribution dielectric layer 424 may be deposited or grown by CVD, PVD, ALD, sputtering, thermal oxidation, some other deposition or growth process, or any combination of the foregoing. In further embodiments, a masking layer (not shown) may be formed over the redistribution dielectric layer 424 (e.g., via a photolithography process). In yet further embodiments, with the masking layer in place, an etching process (e.g., a wet etch, dry etch, etc.) may be performed on the redistribution dielectric layer 424 to remove unmasked portions of the redistribution dielectric layer 424 (e.g., regions of the redistribution dielectric layer 424 disposed over the peripheral region 112 of the first semiconductor wafer 102*a*). In such embodiments, the masking layer may be subsequently stripped away. It will be appreciated that, in some embodiments, the above masking/etching process may be performed on the first etch stop layer 418, the bonding structure dielectric layer 420, and/or the second etch stop layer 422 to remove unmasked portions (e.g., portions disposed over the peripheral regions 112) of the first etch stop layer 418, the bonding structure dielectric layer 420, and/or the second etch stop layer 422. In yet further embodiments, after depositing and/or performing the masking/etching process on the redistribution dielectric layer 424, a first planarization process may be performed on the redistribution dielectric layer 424 to planarize an upper surface of the redistribution dielectric layer 424.

As shown in the cross-sectional view 1000 of FIG. 10, a first dielectric layer 1002 is formed on the redistribution dielectric layer 424. In some embodiments, the first dielectric layer 1002 is formed over the central region 104 of the first semiconductor wafer 102*a*. In further embodiments, the first dielectric layer 1002 may be formed with sidewalls that are substantially aligned with sidewalls of the redistribution dielectric layer 424. In further embodiments, the first dielectric layer 1002 is a different material than the redistribution dielectric layer 424 and may comprise, for example, an oxy-nitride (e.g., silicon oxy-nitride (SiON)), an oxide (e.g., SiO2), a nitride (e.g., SiN), or the like. In further embodiments, a process for forming the first dielectric layer 1002 may comprise depositing or growing the first dielectric layer

1002 on the redistribution dielectric layer 424. In yet further embodiments, the first dielectric layer 1002 may be deposited or grown by CVD, PVD, ALD, sputtering, thermal oxidation, some other deposition or growth process, or a combination of the foregoing.

Figure 11:
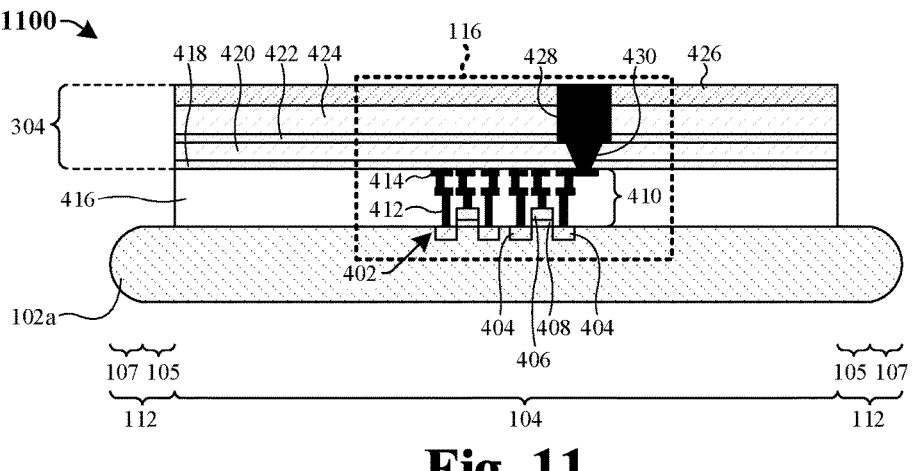

As shown in the cross-sectional view 1100 of FIG. 11, a conductive bonding via 430 and a conductive bonding link 428 are formed over the interconnect structure 410. Further, a second planarization process is performed on the first dielectric layer (1002 of FIG. 10) to form a bonding interface dielectric layer 426. In further embodiments, formation of the conductive bonding link 428, the conductive bonding via 430, and the bonding interface dielectric layer 426 completes formation of a bonding structure 304 and/or a 2D IC 116.

In some embodiments, a process for forming the conductive bonding via 430, the conductive bonding link 428, and the bonding interface dielectric layer 426 comprises: patterning the first dielectric layer (1002 of FIG. 10) and underlying layers according to a masking layer (not shown) to form a conductive feature opening over a conductive wire 414 in the interconnect structure 410; depositing a conductive layer (not shown) on the first dielectric layer (1002 of FIG. 10) that fills the conductive feature opening; and performing the second planarization process into the conductive layer and the first dielectric layer (1002 of FIG. 10), thereby forming the conductive bonding via 430, the conductive bonding link 428, and the bonding interface dielectric layer 426.

In some embodiments, the conductive layer may comprise, for example, copper, aluminum, tungsten, some other conductive material, or a combination of the foregoing. In further embodiments, the conductive layer may be formed by, for example, CVD, PVD, ALD, sputtering, electrochemical plating, electroless plating, some other deposition process, or a combination of the foregoing. In some embodiments, the second planarization process co-planarizes an upper surface of the conductive bonding link 428 and an upper surface of the bonding interface dielectric layer 426. In further embodiments, the second planarization process may be a CMP process or another suitable planarization process.

FIGS. 12A-E illustrate various views of some embodiments of a processing tool and a method for forming a bonding support structure 110 (see FIG. 12D) over the peripheral region 112 of the first semiconductor wafer 102*a*.

Figure 12A:
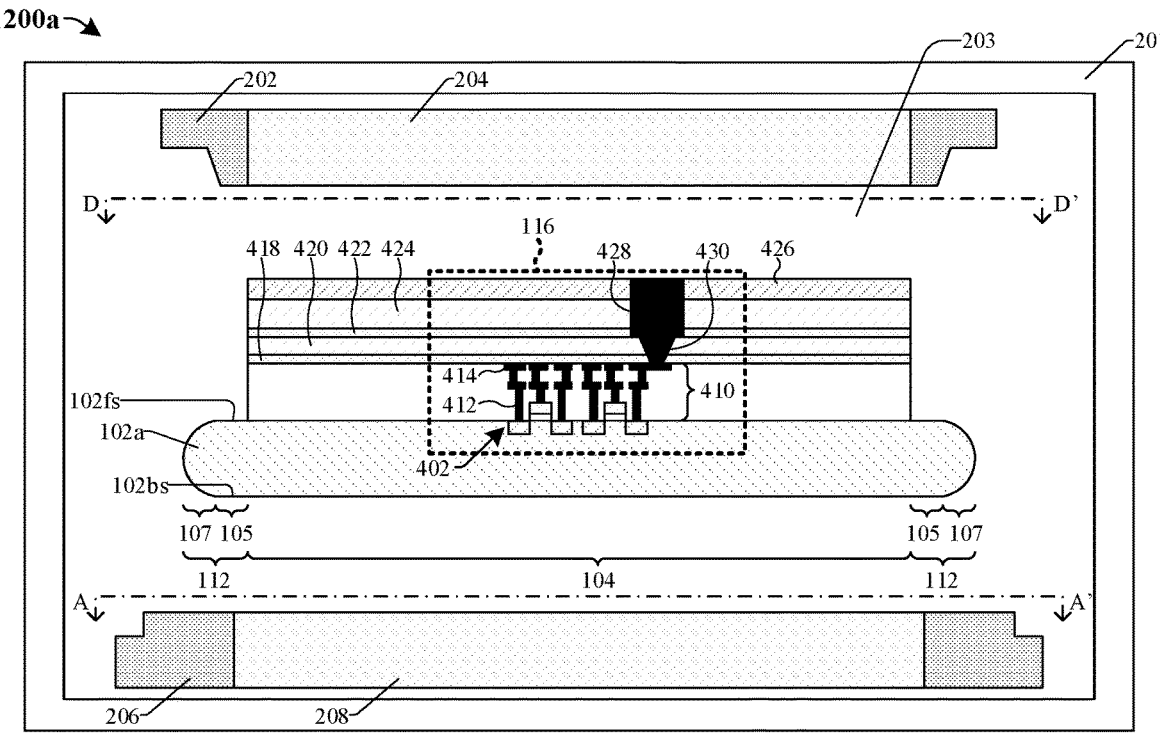

As illustrated in the cross-sectional view 1200*a* of FIG. 12A, the first semiconductor wafer 102*a* is loaded into a vacuum chamber 203 and is disposed vertically between an upper plasma exclusion zone (PEZ) ring 202 and a lower PEZ ring 206. The upper PEZ ring 202 laterally surrounds an upper plate 204 and the lower PEZ ring 206 laterally surrounds a lower plate 208. The semiconductor wafer 102 is disposed within the vacuum chamber 203 and is vertically spaced between the upper PEZ ring 202 and the lower PEZ ring. In some embodiments, the semiconductor wafer 102 may be held within the vacuum chamber 203 by a wafer chuck (not shown), such that the semiconductor wafer 102 is vertically separated from the lower PEZ ring 206 by a non-zero distance. Further, the semiconductor wafer 102 comprises a back-side surface 102*bs* opposite to a front-side surface 102*fs*.

FIG. 12B illustrates a top view 1200*b* of some embodiments of the cross-sectional view 1200*a* taken along the line A-A' of FIG. 12A. As illustrated in FIG. 12B, the lower PEZ ring 206 laterally encloses the lower plate 208. In some embodiments, the lower PEZ ring 206 comprises a PEZ ring notch 207 that has a shape that corresponds to the shape of the notch 103 disposed within the peripheral region 112 of the first semiconductor wafer 102a (see FIG. 5 and/or FIG. 12C). Further, FIG. 12C illustrates a top view 1200c of some embodiments of the cross-sectional view 1200a taken along the line D-D' of FIG. 12A. As illustrated in the top view 1200c of FIG. 12C, an alignment process is performed on the first semiconductor wafer 102a while/after disposing the first semiconductor wafer 102a into the vacuum chamber 203. In some embodiments, the alignment process is performed such that the notch 103 of the first semiconductor wafer 102a directly overlies and/or is aligned with the PEZ ring notch 207 of the lower PEZ ring 206.

Figure 12D:
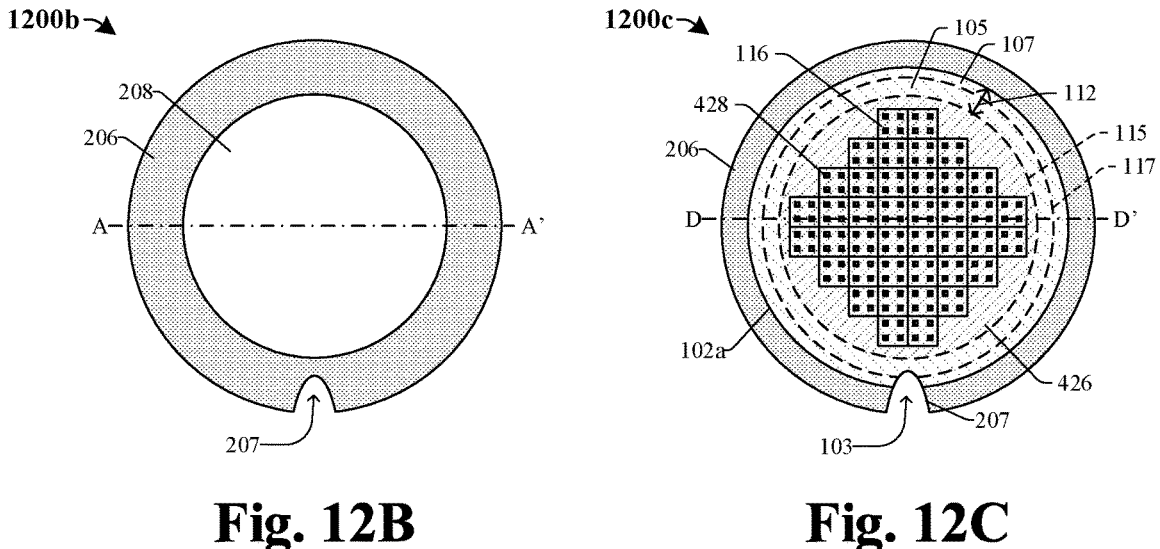
Figure 12D:
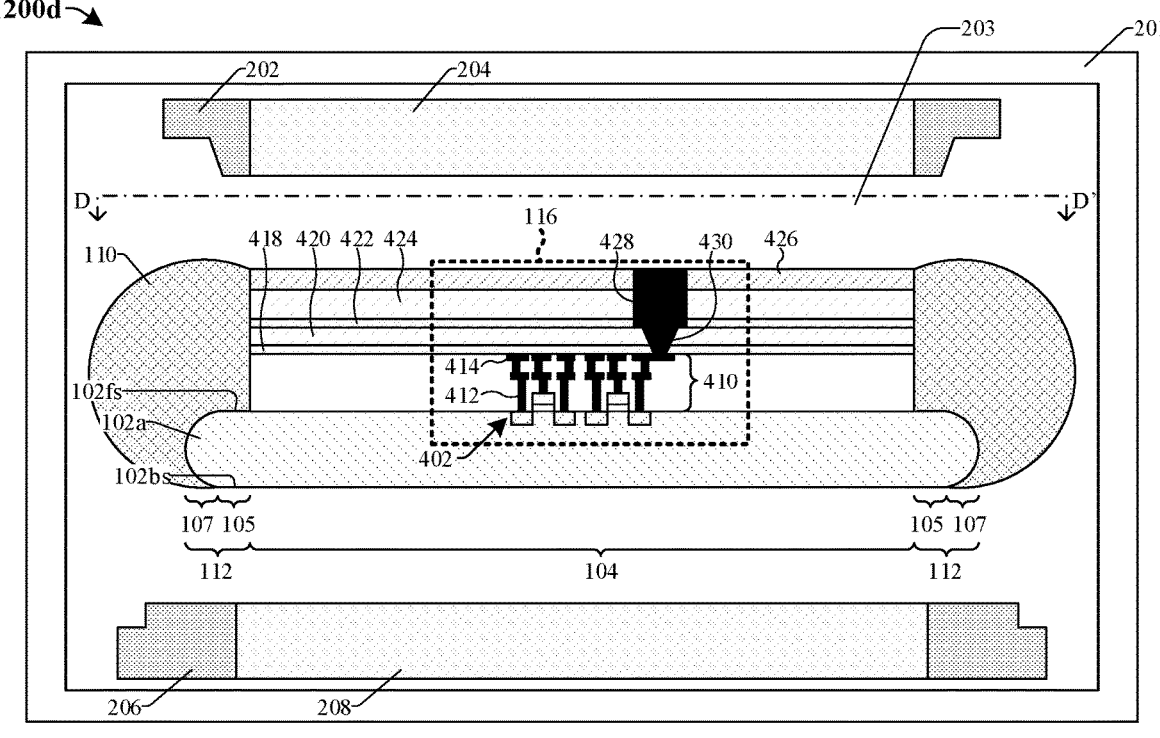

As illustrated in the cross-sectional view 1200d of FIG. 12D, a bonding support structure 110 is formed over the peripheral region 112 of the first semiconductor wafer 102a. In some embodiments, the bonding support structure 110 comprises a layer of a dielectric material that is formed on the first semiconductor wafer 102a and that extends along sidewalls of the plurality of stacked ILD layers 416, the first etch stop layer 418, the bonding structure dielectric layer 420, the second etch stop layer 422, the redistribution dielectric layer 424, and the bonding interface dielectric layer 426. In further embodiments, the bonding support structure 110 is formed such that it extends over the inner peripheral region 105 and the bevel region 107 of the first semiconductor wafer 102a. In yet further embodiments, the bonding support structure 110 may be formed with an upper surface that is substantially planar with the upper surface of the bonding interface dielectric layer 426 (not shown). In further embodiments, the bonding support structure 110 may be formed with outer sidewalls that are substantially aligned with opposite outer edges of the first semiconductor wafer 102a (not shown). In yet further embodiments, the outer sidewalls of the bonding support structure 110 may be formed extending in a substantially vertical line (not shown) (e.g., see FIG. 3C).

In some embodiments, a process for forming the bonding support structure 110 may comprise selectively depositing or growing the bonding support structure 110 on the first semiconductor wafer 102a and over the peripheral region 112 of the first semiconductor wafer 102a. In further embodiments, the bonding support structure 110 may be selectively deposited or grown by CVD, PVD, ALD, sputtering, thermal oxidation, some other deposition or growth process, or any combination of the foregoing. More specifically, in further embodiments, the bonding support structure 110 is selectively deposited by a plasma-enhanced CVD (PECVD).

In some embodiments, the PECVD process comprises loading the first semiconductor wafer 102a into the vacuum chamber 203 (e.g., See FIG. 12A). Loading the first semiconductor wafer 102a into the vacuum chamber 203 may include performing the alignment process such that the notch 103 of the first semiconductor wafer 102a directly overlies and/or is aligned with the PEZ ring notch 207 of the lower PEZ ring 206 (e.g., see FIG. 12C). Subsequently, one or more processing gas(es) are flowed into the vacuum chamber 203, such that the bonding support structure may be selectively deposited over the peripheral region 112 of the first semiconductor wafer 102a. In such embodiments, the upper PEZ ring 202 overlies the front-side surface 102fs of the first semiconductor wafer 102a during the PECVD process. The upper PEZ ring 202 and the upper plate 204 cover the central region 104 of the first semiconductor wafer 102a. In yet further embodiments, during the PECVD process, the upper PEZ ring 202 and the upper plate 204 may be spaced from the first semiconductor wafer 102a by about 0.2 millimeters (mm) to about 3 mm, or another suitable value.

In yet further embodiments, during the PECVD process, the lower PEZ ring 206 and the lower plate 208 are arranged below the back-side surface 102bs of the first semiconductor wafer 102a. The lower PEZ ring 206 and the lower plate 208 are configured to prevent the PECVD process from depositing the bonding support structure 110 on the back-side surface 102bs of the first semiconductor wafer 102a and/or the central region 104 of the first semiconductor wafer 102a. Further, by virtue of the PEZ ring notch 207 of the lower PEZ ring 206 being aligned with the notch 103 of the first semiconductor wafer 102a during the PECVD process (e.g. see FIG. 12C) the lower PEZ ring 206 may not bock deposition of the bonding support structure 110 along and/ around the notch 103 the first semiconductor wafer 102a. Thus, a step height of the bonding support structure 110 around the notch 103 may be reduced, such that a thickness of the bonding support structure 110 around the notch 103 of the first semiconductor wafer 102a is substantially similar to a thickness of the bonding support structure 110 in an area of the peripheral region 112 of the first semiconductor wafer 102a on a side opposite to the notch 103. In such embodiments, because the step height of the bonding support structure 110 around the notch 103 is relatively small (e.g., less than 10,000 angstroms) (e.g., see FIG. 12F), step height related issues may be reduced in subsequent processing steps. In further embodiments, during the PECVD process, the lower PEZ ring 206 and/or the lower plate 208 may be spaced from the first semiconductor wafer 102a by about 0.2 mm to about 3 mm, or another suitable value. In yet further embodiments, after the bonding support structure 110 is formed, a wafer cleaning process may be performed on the first semiconductor wafer 102a.

Figure 12E:
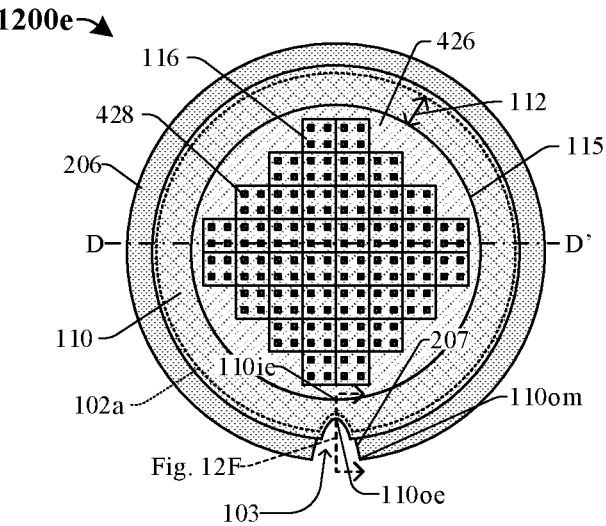

FIG. 12E illustrates a top view 1200e of some embodiments of the cross-sectional view 1200d taken along the line D-D' of FIG. 12D. As illustrated in FIG. 12E, the bonding support structure 110 may laterally extend from the IC region edge 115 to the outermost edge of the first semiconductor wafer 102a. Further, the bonding support structure 110 was formed in such a manner that it extends along the notch 103 of the first semiconductor wafer 102a.

Figure 12F:
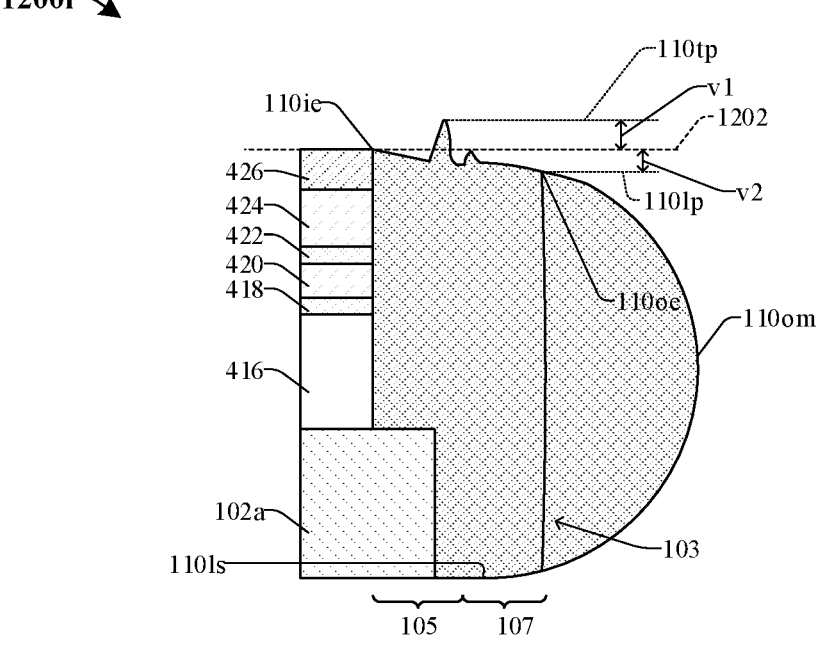

FIG. 12F illustrates a cross-sectional view 1200f of some embodiments of a portion of the top view 1200e taken along the dashed line FIG. 12E. In some embodiments, a height of the bonding support structure 110 around and/or over the notch 103 may vary from an inner edge 110ie of the bonding support structure 110 to an outer edge 110oe of the bonding support structure 110. Further, a substantially straight line 1202 is aligned with an upper surface of the bonding interface dielectric layer 426. In some embodiments, the substantially straight line 1202 is parallel with a top surface of the first semiconductor wafer 102a. In yet further embodiments, a top surface of the inner edge 110ie of the bonding support structure 110 is aligned with the substantially straight line 1202.

In some embodiments, the height of the bonding support structure 110 (e.g., measured from a bottom surface of the first semiconductor wafer 102a to an upper surface of the bonding support structure 110) may vary from the inner edge 110ie of the bonding support structure 110 to the outer edge 110oe off the bonding support structure 110. In some embodiments, the height of the bonding support structure 110 may vary (e.g., within a range of about −10,000 to 10,000 Angstroms) from the substantially straight line 1202. In further embodiments, a first vertical distance v1 between the substantially straight line 1202 and a top point 110*tp* of the bonding support structure 110 is within a range of about 0 to 10,000 angstroms, less than 10,000 angstroms, or another suitable value. Further, a second vertical distance v2 between the substantially straight line 1202 and a bottom point 1101*p* of the bonding support structure 110 is within a range of about 0 to 10,000 Angstroms, less than about 10,000 angstroms, or another suitable value. Thus, in some embodiments, an absolute value of a step height of the bonding support structure 110 from the inner edge 110*ie* to the outer edge 110*oe* is within a range of about 0 to 10,000 Angstroms, less than about 10,000 Angstroms, or another suitable value. By virtue of the step height being substantially small (e.g., less than about 10,000 angstroms) step height issues may be mitigated during subsequent processing steps. In yet further embodiments, a height (e.g., measured from the substantially straight line 1202 to a lower surface 1101*s* of the bonding support structure 110) of the bonding support structure 110 along the lower surface 1101*s* may vary from a sidewall of the first semiconductor wafer 102*a* to the outer edge 110*oe* of the bonding support structure 110 (not shown). In such embodiments, the variation in height is relatively small (e.g., less than 10,000 Angstroms), thereby mitigating step height issues during subsequent processing steps. This, in part, increases a structural integrity of the bonding support structure 110 and the first semiconductor wafer 102*a*.

Figure 13:
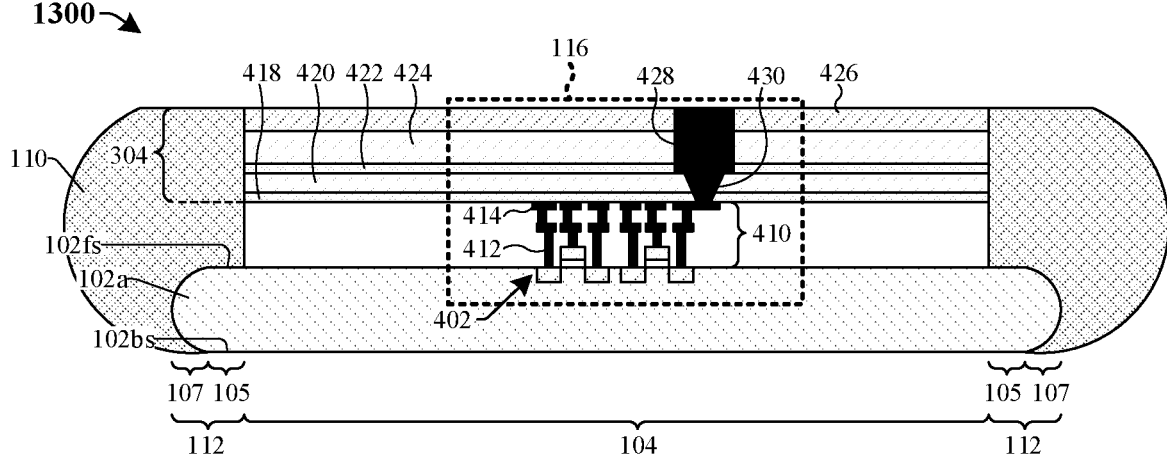

As shown in the cross-sectional view 1300 of FIG. 13, a planarization process (e.g., CMP) is performed on the bonding support structure 110, such that an upper surface of the bonding support structure 110 is substantially planar. In some embodiments, the planarization process is performed such that an upper surface of the bonding interface dielectric layer 426 is co-planar with the upper surface of the bonding support structure 110. Making the step height of the bonding support structure 110 around the notch (103 of FIGS. 12E-F) relatively small (e.g., an absolute value less than about 10,000 angstroms) mitigates associate step height issues. This, in part, mitigates damage (e.g., delamination, cracking, etc.) to the bonding support structure 110 during the planarization process. In some embodiments, the planarization process may be omitted, such that the method of FIGS. 5-17 flows from FIGS. 5-12F to FIGS. 14-12 (skipping FIG. 13). In yet further embodiments, the bonding support structure 110 may be selectively deposited such that it comprises a substantially flat upper surface.

Figure 14:
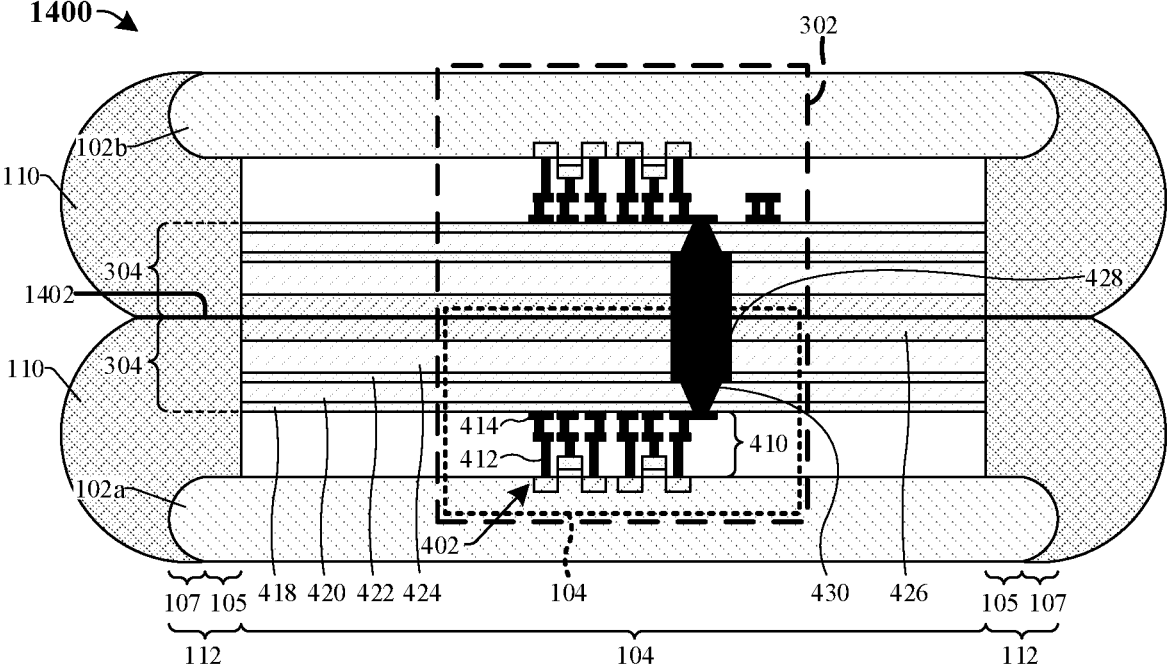

As shown in the cross-sectional view 1400 of FIG. 14, the first semiconductor wafer 102*a* is bonded to a second semiconductor wafer 102*b* to form a 3D IC 302. In some embodiments, the first semiconductor wafer 102*a* is bonded to the second semiconductor wafer 102*b* by bonding the interface dielectric layer 426, the conductive bonding link 428, and the bonding support structure 110 of the first semiconductor wafer 102*a* to a bonding interface dielectric layer 426, a conductive bonding link 428, and bonding support structure 110 of the second semiconductor wafer 102*b*, respectively. In further embodiments, bonding the first semiconductor wafer 102*a* to the second semiconductor wafer 102*b* forms a bonding interface 1402 along the bonding interface dielectric layers 426, the conductive bonding links 428, and the bonding support structure 110 of the first and second semiconductor wafers 102*a-b*. It will be appreciated that bonding the first semiconductor wafer 102*a* to the second semiconductor wafer 102*b* may form a plurality of 3D ICs.

In some embodiments, the bonding interface 1402 comprises dielectric-to-dielectric bonds between the bonding interface dielectric layers 426 of the first and second semiconductor wafers 102*a-b*. In further embodiments, the bonding interface 1402 comprises conductor-to-conductor bonds between the conductive bonding links 428 of the first and second semiconductor wafers 102*a-b*. In yet further embodiments, the bonding interface 1402 comprises dielectric-to-dielectric bonds between the bonding support structures 110 of the first and second semiconductor wafers 102*a-b*.

In some embodiments, a process for bonding the first semiconductor wafer 102*a* to the second semiconductor wafer 102*b* comprises flipping (e.g., rotating 180 degrees) the second semiconductor wafer 102*b*, such that the bonding interface dielectric layer 426 of the second semiconductor wafer 102*b* faces the bonding interface dielectric layer 426 of the first semiconductor wafer 102*a*. Thereafter, the first semiconductor wafer 102*a* is bonded to the second semiconductor wafer 102*b* by, for example, hybrid bonding, eutectic bonding, any combination of the foregoing, or the like. It will be appreciated that additional semiconductor wafers may be bonded to the first semiconductor wafer 102*a* and/or the second semiconductor wafer 102*b* by a substantially similar bonding process. In yet further embodiments, it will be appreciated that a process for forming the second semiconductor wafer 102*b* may include the processing steps of FIGS. 5-13. In some embodiments, the second semiconductor wafer 102*b* may comprise a notch (not shown) that is substantially similar to a shape and/or size of the notch (103 of FIG. 12E) of the first semiconductor wafer 102*a*. In yet further embodiments, bonding the first semiconductor wafer 102*a* to the second semiconductor wafer 102*b* includes performing an alignment process such that the notch of the second semiconductor wafer 102*b* directly overlies and/or is aligned with the notch of the first semiconductor wafer 102*a*.

Because the bonding support structures 110 have the relatively small step height around the notches of the first and second semiconductor wafers 102*a-b*, respectively, non-bond (NB) regions over the peripheral regions 112 of the first semiconductor wafer 102*a* may be reduced. By reducing the NB regions over the peripheral regions 112 of the first semiconductor wafer 102*a*, during bonding, structural support between the first semiconductor wafer 102*a* and the second semiconductor wafer 102*b* may be improved. The improved structural support may reduce unwanted mechanical stresses during bonding and/or during subsequent processing steps of the bonded together semiconductor wafers. Accordingly, the bonding support structures 110 may improve the yield of 3D ICs.

Figure 15:
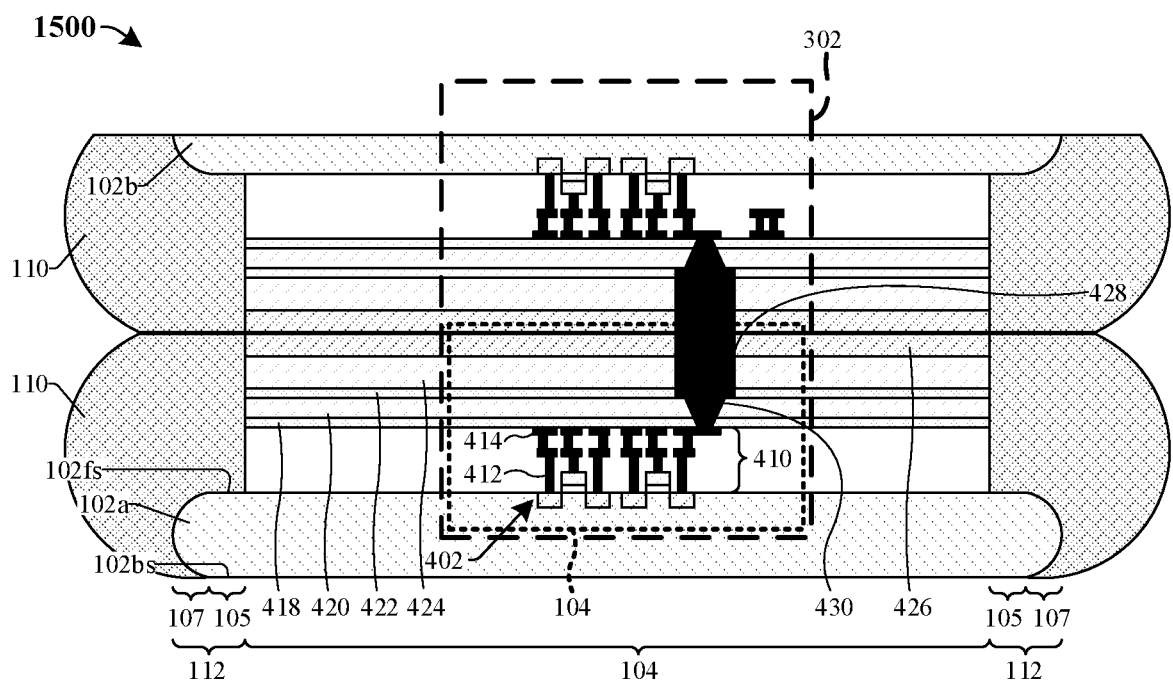

As illustrated in the cross-sectional view 1500 of FIG. 15, a thinning process (e.g., CMP) is performed on the second semiconductor wafer 102*b* and the bonding support structure 110 that contacts the second semiconductor wafer 102*b*. In some embodiments, the thinning process includes performing a CMP process, a mechanical grinding process, another suitable process, or any combination of the foregoing. Making the step height of the bonding support structure 110 around the notch of the second semiconductor wafer 102*b* relatively small (e.g., an absolute value less than about 10,000 angstroms) mitigates associated step height issues. This, in part, mitigates damage (e.g., delamination, cracking, etc.) to the bonding support structure 110 and/or the second semiconductor wafer 102*b* in regions touching and/or adjacent to the notch of the second semiconductor wafer 102*b*. In yet further embodiments, after the thinning process, the upper surface of the second semiconductor wafer 102*b* is substantially co-planar with the upper surface of the bonding support structure 110.

Figure 16:
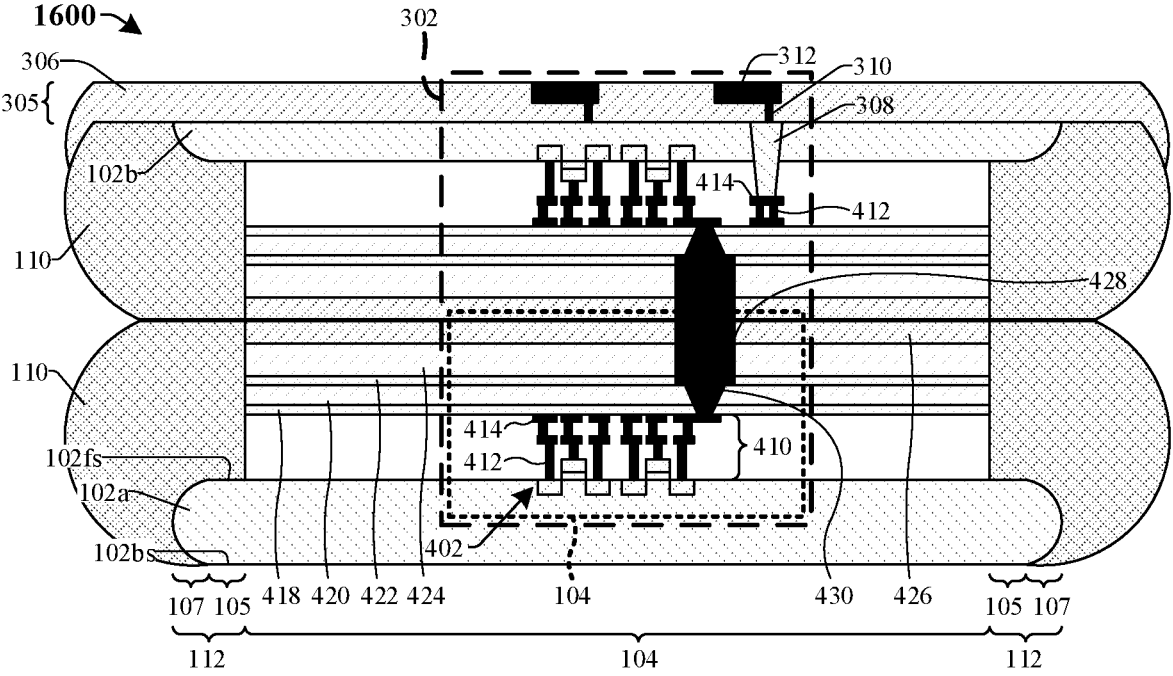

As illustrated in the cross-sectional view 1600 of FIG. 16, an input/output (I/O) structure 305 may be formed over the second semiconductor wafer 102*b*. In yet further embodiments, before forming the I/O structure 305, a through-substrate via (TSV) 308 may be formed within the second semiconductor wafer 102*b* and may contact and/or be directly electrically coupled to a conductive wire 414 and/or a conductive via 412. In some embodiments, the I/O structure 305 comprises a plurality of upper contacts 312 and a plurality of upper contact vias 310 that are disposed in/over an upper dielectric structure 306. In some embodiments, the TSV 308 may, for example, be or comprise copper, tungsten, aluminum, N-doped silicon, P-doped silicon, another conductive material, or any combination of the foregoing. In yet further embodiments, the TSV 308 may, for example, be formed by CVD, PVD, sputtering, electroless plating, ion implantation, another suitable deposition or growth process, or any combination of the foregoing.

In some embodiments, a process for forming the I/O structure 305 may include depositing or growing a dielectric layer (not shown) over the second semiconductor wafer 102*b*. In some embodiments, the dielectric layer may comprise, for example, an oxide (e.g., SiO2), a nitride (e.g., SiN), an oxy-nitride (e.g., SiON), or the like. In some embodiments, the dielectric layer may be deposited or grown by CVD, PVD, ALD, sputtering, thermal oxidation, some other deposition or growth process, or a combination of the foregoing.

Thereafter, a plurality of openings (not shown) are formed in the dielectric layer (e.g., via a photolithography process) that extends through the dielectric layer to a corresponding TSV 308. It will be appreciated that only a single TSV 308 is illustrated in FIG. 16, however, multiple TSVs may be disposed and/or formed within the second semiconductor wafer 102*b* such that each opening exposes the upper surface of a corresponding TSV. A conductive layer (not shown) is then deposited on the dielectric layer and fills the openings. In some embodiments, the conductive layer may comprise, for example, copper, aluminum, tungsten, some other conductive material, or a combination of the foregoing. In some embodiments, the conductive layer may be deposited by CVD, PVD, ALD, sputtering, electrochemical plating, electroless plating, some other deposition process, or a combination of the foregoing. Subsequently, a planarization process (e.g., CMP) is performed on the conductive layer and into the dielectric layer to form the plurality of upper contact vias 310, the plurality of upper contacts 312, and the upper dielectric structure 306.

Figure 17:
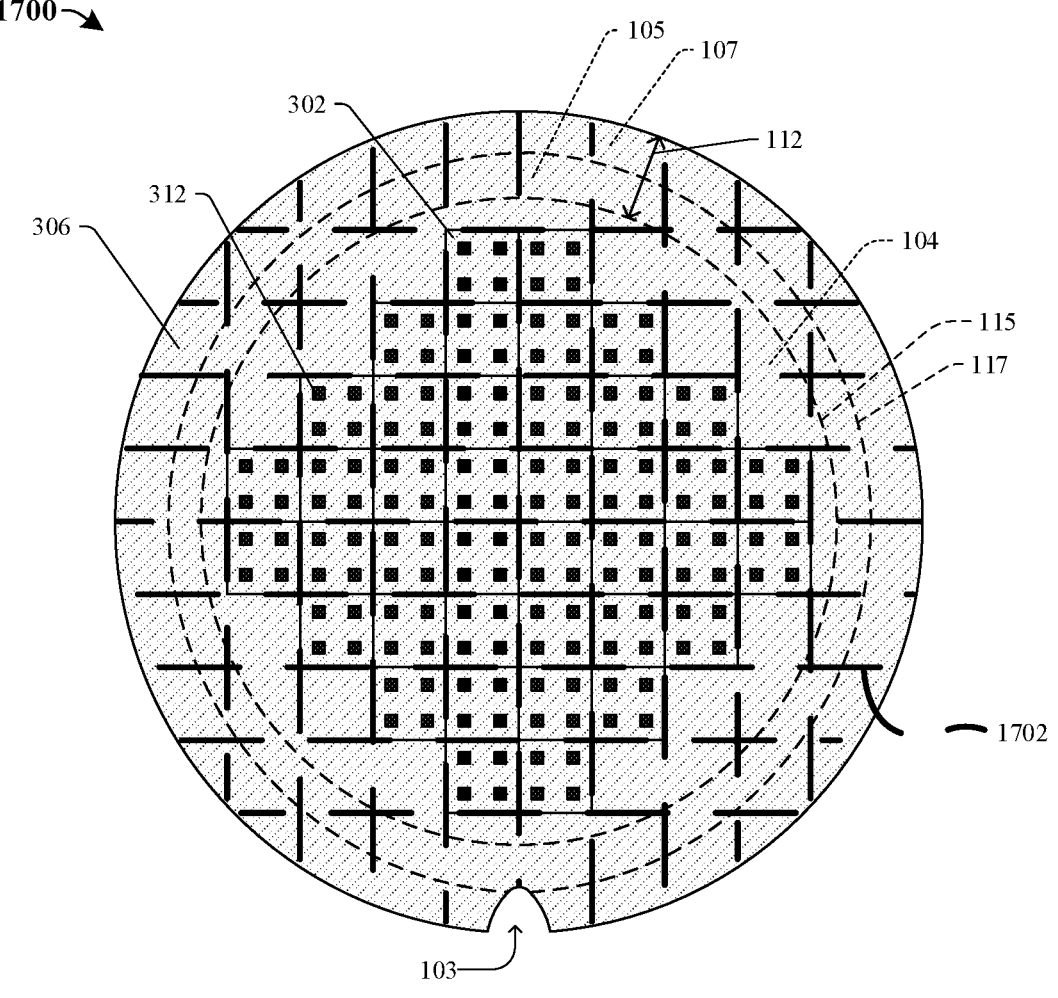

FIG. 17 illustrates a top view 1700 of some embodiments of the first and second semiconductor wafers 102*a-b* of FIG. 16. As shown in FIG. 17, the bonded together first and second semiconductor wafers 102*a-b* (e.g., see FIG. 16) comprises a plurality of 3D ICs 302 arranged in an array. In some embodiments, the array comprises a plurality of rows and columns. As illustrated in FIG. 17, in some embodiments, a wafer dicing process may be performed on the bonded together first and second semiconductor wafers 102*a-b*. The wafer dicing process may comprise performing a series of cuts into the bonded together first and second semiconductor wafers 102*a-b* to form a plurality of scribe lines 1702. The scribe lines 1702 are cut into the bonded together first and second semiconductor wafers 102*a-b* between each of the rows and columns to singulate the bonded together first and second semiconductor wafers 102*a-b* into a plurality of separate 3D ICs 302. Subsequently, a mechanical force is applied to the bonded together first and second semiconductor wafers 102-*b* to singulate the die. In further embodiments, the cut may be performed by, for example, mechanical sawing, laser cutting, another suitable cutting process, or the like.

FIG. 18 illustrates a method 1800 of forming bonding support structures along and/or over notches of a first semiconductor wafer and a second semiconductor wafer, respectively, and bonding the first semiconductor wafer to the second semiconductor wafer is provided. Although the method 1800 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1802, a plurality of semiconductor devices are formed over and/or on a central region of a first semiconductor wafer. A peripheral region of the first semiconductor wafer laterally encloses the central region, and the first semiconductor wafer comprises a notch disposed within the peripheral region. FIGS. 5-6 illustrate various views corresponding to some embodiments of act 1802.

At act 1804, an interconnect structure is formed over the plurality of semiconductor devices. FIG. 6 illustrates a cross-sectional view 600 corresponding to some embodiments of act 1804.

At act 1806, a bonding structure is formed over the interconnect structure. FIGS. 6-11 illustrate cross-sectional views 600-1100 corresponding to some embodiments of act 1806.

At act 1808, a bonding support structure is formed over the peripheral region of the first semiconductor wafer such that the bonding support structure continuously extends along the notch. Forming the bonding support structure includes utilizing an upper PEZ ring and a lower PEZ ring. The first semiconductor wafer is disposed between the upper and lower PEZ rings. Further, the lower PEZ ring comprises a PEZ ring notch that is aligned with the notch of the first semiconductor wafer while forming the bonding support structure. FIGS. 12A-F illustrate various views corresponding to some embodiments of act 1808.

At act 1810, the first semiconductor wafer is bonded to a second semiconductor wafer, where a second bonding support structure is disposed on a peripheral region and along a notch of the second semiconductor wafer. FIG. 14 illustrates a cross-sectional view 1400 corresponding to some embodiments of act 1810.

At act 1812, a thinning process is performed into the second semiconductor wafer and the second bonding support structure. FIG. 15 illustrates a cross-sectional view 1500 corresponding to some embodiments of act 1812.

At act 1814, a wafer dicing process is performed on the bonded together first and second semiconductor wafers to form a plurality of 3D ICs. FIG. 17 illustrates a top view 1700 corresponding to some embodiments of act 1814.

Accordingly, in some embodiments, the present disclosure relates to a method for forming a bonding support structure along and/or over a notch of a first semiconductor wafer, where during deposition of the bonding support structure a lower PEZ ring directly underlies the first semiconductor wafer. The lower PEZ ring comprises a PEZ right notch that directly underlies the notch of the first semiconductor wafer.

In some embodiments, the present application provides a method for forming an integrated chip, the method includes: forming a plurality of semiconductor devices over a central region of a semiconductor wafer, wherein the semiconductor wafer comprises a peripheral region laterally surrounding the central region, wherein a circumferential edge of the semiconductor wafer is disposed within the peripheral region, wherein the semiconductor wafer comprises a notch disposed along the circumferential edge and within the peripheral region; forming a stack of inter-level dielectric (ILD) layers over the semiconductor devices and disposed laterally within the central region; and forming a bonding support structure over the peripheral region of the semiconductor wafer, such that the bonding support structure comprises a bonding structure notch disposed along a circumferential edge of the bonding support structure, wherein the bonding structure notch extends inwardly towards the notch of the semiconductor wafer, wherein forming the bonding support structure includes disposing the semiconductor wafer over a lower plasma exclusion zone (PEZ) ring that comprises a PEZ ring notch disposed along a circumferential edge of the lower PEZ ring such that the PEZ ring notch is aligned with the notch of the semiconductor wafer.

In some embodiments, the present application provides a processing tool, including: a housing defining a vacuum chamber; a semiconductor wafer disposed within the vacuum chamber, wherein the semiconductor wafer comprises a back-side surface opposite to a front-side surface, wherein the semiconductor wafer comprises a notch disposed along a circumferential edge of the semiconductor wafer, wherein the notch extends inwardly from the circumferential edge; an upper plasma exclusion zone (PEZ) ring overlying the front-side surface of the semiconductor wafer; and a lower PEZ ring underlying the back-side surface of the semiconductor wafer, wherein the lower PEZ ring comprises a PEZ ring notch that extends inwardly from a circumferential edge of the lower PEZ ring, wherein the PEZ ring notch directly underlies the notch of the semiconductor wafer.

In some embodiments, the present application provides a method for forming an integrated chip, the method includes: forming a first integrated circuit (IC) over a central region of a first semiconductor wafer, wherein the first semiconductor wafer comprises a notch disposed along a circumferential edge of the first semiconductor wafer, wherein the notch extends inwardly from the circumferential edge; forming a first bonding support structure over a peripheral region of the first semiconductor wafer, such that the first bonding support structure comprises a bonding structure notch disposed along a circumferential edge of the first bonding support structure, wherein the bonding structure notch extends inwardly towards the notch of the first semiconductor wafer, wherein the peripheral region laterally encloses the central region of the first semiconductor wafer, and wherein the first bonding support structure continuously extends along the notch of the first semiconductor wafer; bonding a second semiconductor wafer to the first semiconductor wafer, such that a second IC disposed on the second semiconductor wafer is electrically coupled to the first IC, wherein a second bonding support structure disposed on a peripheral region of the second semiconductor wafer contacts the first bonding support structure; and performing a thinning process on the second semiconductor wafer and the second bonding support structure to reduce a thickness of the second semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A processing tool comprising:
a housing structure defining a chamber;
a first plate disposed in the chamber;
a first plasma exclusion zone (PEZ) ring disposed on the first plate;
a second plate disposed in the chamber and underlying the first plate; and
a second PEZ ring disposed on the second plate, wherein the second PEZ ring comprises a PEZ ring notch that extends inwardly from a circumferential edge of the second PEZ ring, wherein a height of the PEZ ring notch is equal to a height of the second PEZ ring.

2. The processing tool of claim 1, wherein the processing tool comprises a wafer chuck configured to hold a semiconductor substrate comprising a substrate notch that extends inwardly from a circumferential edge of the semiconductor substrate, wherein the PEZ ring notch directly underlies the substrate notch.

3. The processing tool of claim 2, wherein the PEZ ring notch and the substrate notch comprise a same shape, wherein a size of the PEZ ring notch is greater than a size of the substrate notch.

4. The processing tool of claim 1, wherein outer sidewalls of the first PEZ ring are spaced laterally between outer sidewalls of the second PEZ ring.

5. The processing tool of claim 1, wherein the first PEZ ring comprises a bottom surface and an upper surface that is spaced vertically above the bottom surface of the first PEZ ring, wherein a height of the first PEZ ring continuously decreases from the bottom surface of the first PEZ ring to the upper surface of the first PEZ ring.

6. The processing tool of claim 1, wherein a distance between the PEZ ring notch and a circumferential edge of the second plate is less than a width of the PEZ ring notch.

7. The processing tool of claim 1, wherein the first PEZ ring and the second PEZ ring respectively comprise yttrium oxide.

8. The processing tool of claim 1, wherein the height of the second PEZ ring discretely decreases from an inner surface of the second PEZ ring to an outer surface of the second PEZ ring in a direction towards the outer surface of the second PEZ ring.

9. The processing tool of claim 1, wherein the first PEZ ring has a continuous ring shape that is devoid of a notch extending inwardly from the circumferential edge of the first PEZ ring.

10. A processing tool comprising:
a housing structure; and
a plate structure disposed within the housing structure and comprising a plasma exclusion zone (PEZ) ring laterally enclosing a plate, wherein the PEZ ring comprises one or more surfaces defining a PEZ notch disposed at an outer region of the plate structure, wherein the PEZ notch underlies a substrate notch of a semiconductor substrate disposed in the housing structure, wherein the one or more surfaces comprise a first sidewall segment adjacent to an outer perimeter of the PEZ ring and a second sidewall segment adjacent to the outer perimeter of the PEZ ring, wherein the first sidewall segment is laterally offset from the second sidewall segment by a lateral distance, wherein the PEZ ring is discontinuous across the lateral distance.

11. The processing tool of claim 10, wherein the processing tool is configured to flow one or more processing gas(es) into the housing structure while the substrate notch overlies the PEZ notch such that the one or more processing gas(es) is or are directed towards the substrate notch.

12. The processing tool of claim 11, wherein the processing tool is configured to deposit a dielectric structure along the substrate notch while flowing the one or more processing gas(es).

13. The processing tool of claim 12, wherein the dielectric structure comprises a notch extending inwardly from a circumferential edge of the dielectric structure, wherein the notch of the dielectric structure conforms to a shape of the PEZ notch.

14. The processing tool of claim 10, wherein the one or more surfaces of the PEZ ring comprise a first planar surface and a second planar surface that meet at a point, wherein the first sidewall segment is part of the first planar surface and the second sidewall segment is part of the second planar surface, wherein heights of the first and second sidewall segments are less than a height of the PEZ ring at the point.

15. The processing tool of claim 10, wherein the one or more surfaces of the PEZ ring comprise a curved surface laterally offset from the first and second sidewall segments.

16. A processing tool comprising:

a housing structure;

an upper plate structure disposed within the housing structure and comprising an upper plasma exclusion zone (PEZ) ring disposed around an outer perimeter of an upper plate; and a lower plate structure disposed within the housing structure and underlying the upper plate structure, wherein the lower plate structure comprises a lower PEZ ring laterally disposed around an outer perimeter of a lower plate, wherein the lower PEZ ring comprises a PEZ ring notch disposed along a circumferential edge of the lower PEZ ring, wherein the PEZ ring notch continuously vertically extends from a top surface of the lower PEZ ring to a bottom surface of the lower PEZ ring.

17. The processing tool of claim 16, wherein a width of the lower PEZ ring is greater than a width of the upper PEZ ring.

18. The processing tool of claim 16, wherein a size of the lower plate structure is greater than a size of the upper plate structure.

19. The processing tool of claim 16, wherein the lower PEZ ring comprises an inner region having a first height and an outer region having a second height less than the first height, wherein a width of the inner region of the lower PEZ ring is greater than a width of the upper PEZ ring.

20. The processing tool of claim 19, wherein the second height is less than a height of the lower plate.

* * * * *